United States Patent
Lu et al.

(10) Patent No.: US 12,265,728 B2
(45) Date of Patent: Apr. 1, 2025

(54) SCHEME FOR FINDING AND CHECKING WHETHER PAGE UNITS IN ONE BLOCK ARE EMPTY PAGES BY USING FLASH MEMORY DEVICE AND REPORTING FUND RESULT FROM FLASH MEMORY DEVICE TO FLASH MEMORY CONTROLLER

(71) Applicant: Silicon Motion, Inc., Hsinchu County (TW)

(72) Inventors: Tsu-Han Lu, Hsinchu (TW); Hsiao-Chang Yen, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 18/203,066

(22) Filed: May 30, 2023

(65) Prior Publication Data
US 2024/0402937 A1   Dec. 5, 2024

(51) Int. Cl.
*G06F 3/06* (2006.01)

(52) U.S. Cl.
CPC .......... *G06F 3/0656* (2013.01); *G06F 3/0604* (2013.01); *G06F 3/064* (2013.01); *G06F 3/0679* (2013.01)

(58) Field of Classification Search
CPC ...... G05B 13/00–048; G05B 15/00–02; G05B 17/00–02; G06F 1/00–3296;
(Continued)

(56) References Cited

U.S. PATENT DOCUMENTS 7,590,793 B2 * 9/2009 Osakabe .............. G11C 16/105 714/48
9,075,740 B2 * 7/2015 Nagadomi .......... G06F 11/1016
(Continued)

FOREIGN PATENT DOCUMENTS

CN    101499026        8/2009
CN    114115700 A  *   3/2022

OTHER PUBLICATIONS

NAND Flash 101; ATP Electronics; 2020; retrieved from https://www.simms.co.uk/Uploads/Resources/50/f4366381-b992-425a-bec4-cca409b51a6c.pdf on May 10, 2024 (Year: 2020).*
(Continued)

*Primary Examiner* — Daniel C. Chappell
(74) *Attorney, Agent, or Firm* — Winston Hsu

(57) ABSTRACT

A flash memory controller is used in a storage device and coupled to a flash memory device of the storage device through a specific communication interface and includes an input/output (I/O) circuit and a processor. The I/O circuit is coupled to the flash memory device through the specific communication interface, and used for sending commands and data between the flash memory device and the processor. The processor is used for controlling the I/O circuit sending a specific boundary check command signal or a specific boundary check set-feature signal via the specific communication interface to the flash memory device, to make the flash memory device read out more page data of multiple page units from a specific block in the memory cell array and to make the flash memory device determine whether the multiple page units are empty pages.

30 Claims, 19 Drawing Sheets

(58) Field of Classification Search
CPC ............... G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 12,066,932 | B2* | 8/2024 | Hu | G06F 3/0688 |
| 12,067,240 | B2* | 8/2024 | Lu | G06F 3/0679 |
| 2005/0188148 | A1* | 8/2005 | Osakabe | G11C 16/102 |
| | | | | 711/103 |
| 2010/0161881 | A1* | 6/2010 | Nagadomi | G06F 12/0246 |
| | | | | 711/E12.008 |
| 2014/0289588 | A1* | 9/2014 | Nagadomi | G11C 16/102 |
| | | | | 714/768 |
| 2020/0174704 | A1* | 6/2020 | Lee | G06F 3/0679 |
| 2024/0161827 | A1* | 5/2024 | Liu | G11C 16/0483 |
| 2024/0168892 | A1* | 5/2024 | Luo | G06F 11/108 |

OTHER PUBLICATIONS

X. Zou, L. Jin, D. Jiang, Y. Zhang, G. Chen and Z. Huo, "Investigation of Cycling-Induced Dummy Cell Disturbance in 3D NAND Flash Memory," in IEEE Electron Device Letters, vol. 39, No. 2, pp. 188-191, Feb. 2018, doi: 10.1109/LED.2017.2785843. (Year: 2018).*

* cited by examiner

SCHEME FOR FINDING AND CHECKING WHETHER PAGE UNITS IN ONE BLOCK ARE EMPTY PAGES BY USING FLASH MEMORY DEVICE AND REPORTING FUND RESULT FROM FLASH MEMORY DEVICE TO FLASH MEMORY CONTROLLER

BACKGROUND OF THE INVENTION

1. Field of the Invention

The invention relates to a storage device, and more particularly to a storage device, a flash memory device, a flash memory controller, and corresponding methods.

2. Description of the Prior Art

Generally speaking, when the power provided for a conventional flash memory controller is suddenly turned off and then turned on again, in a sequential write mode, the conventional flash memory controller needs to know which page unit in a block is the last one data page accessed or written by the flash memory controller. The conventional flash memory controller inevitably needs to ask the conventional flash memory device report multiple page data of the page units in the block by sending multiple read commands into the conventional flash memory device, and then the conventional flash controller is arranged to determine whether the read multiple page data is empty to determine whether the page units are empty pages or not by itself. This inevitably consumes more power for the conventional flash memory controller, and also the loading of the conventional flash memory controller will be heavy since the computation will be complex.

SUMMARY OF THE INVENTION

Therefore one of the objectives of the invention is to provide a storage device, a flash memory controller, and corresponding methods, to solve the above-mentioned problems.

According to embodiments of the invention, a flash memory device to be used in a storage device and coupled to a flash memory controller of the storage device through a specific communication interface is disclosed. The flash memory device comprises an input/output (I/O) control circuit, a command register, an address register, a memory cell array, at least one address decoder, a status register, and a control circuit. The input/output (I/O) control circuit is coupled to the flash memory controller through the specific communication interface. The command register is coupled to the I/O control circuit, and used for buffering command information sent from the flash memory controller and transmitted through the I/O control circuit. The address register is coupled to the I/O control circuit, and used for buffering address information sent from the flash memory controller and transmitted through the I/O control circuit. The memory cell array at least has a first plane and a second plane which is different from the first plane. The at least one address decoder is coupled to the memory cell array. The status register is coupled to the I/O control circuit. The control circuit is coupled to the logic control circuit, the memory cell array, the address register, the command register, and the status register, and used for controlling the at least one address decoder to read out more page data of multiple page units from a specific block in the memory cell array to determine whether the multiple page units are empty pages in response to a specific boundary check command signal or a specific boundary check set-feature signal sent from the flash memory controller via the specific communication interface.

According to the embodiments, a method of a flash memory device to be used in a storage device and coupled to a flash memory controller of the storage device through a specific communication interface is disclosed. The method comprises: providing an input/output (I/O) control circuit, coupled to the flash memory controller through the specific communication interface; providing a command register, coupled to the I/O control circuit, for buffering command information sent from the flash memory controller and transmitted through the I/O control circuit; providing an address register, coupled to the I/O control circuit, for buffering address information sent from the flash memory controller and transmitted through the I/O control circuit; providing a memory cell array, at least having a first plane and a second plane which is different from the first plane; providing at least one address decoder, coupled to the memory cell array; providing at least one address decoder; providing a status register, coupled to the I/O control circuit; and, controlling the at least one address decoder to read out more page data of multiple page units from a specific block in the memory cell array to determine whether the multiple page units are empty pages in response to a specific boundary check command signal or a specific boundary check set-feature signal sent from the flash memory controller via the specific communication interface.

According to the embodiments, a flash memory controller to be used in a storage device and coupled to a flash memory device of the storage device through a specific communication interface is disclosed. The flash memory controller comprises an input/output (I/O) circuit and a processor. The input/output (I/O) circuit is coupled to the flash memory device through the specific communication interface, and used for sending commands and data between the flash memory device and the processor. The processor is coupled to the I/O circuit, and used for controlling the I/O circuit sending a specific boundary check command signal or a specific boundary check set-feature signal via the specific communication interface to the flash memory device, to make the flash memory device read out more page data of multiple page units from a specific block in the memory cell array and to make the flash memory device determine whether the multiple page units are empty pages.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution capable of using a flash memory controller to control a flash memory device searching for and determining which page units in a specific block is/are non-accessed empty page(s). It is not required for the flash memory device to transmit data of page units of the specific block to the flash memory controller to make the flash memory controller determine whether the data of the pages units is empty. The flash memory device can report and transmit a boundary position between accessed data pages and non-accessed empty pages within the specific block into the flash memory controller, i.e. the flash memory controller can directly receive a report result of the boundary position and does not need to check whether the page units are empty by itself. The loading of the flash memory controller can be significantly reduced.

Figure 1:
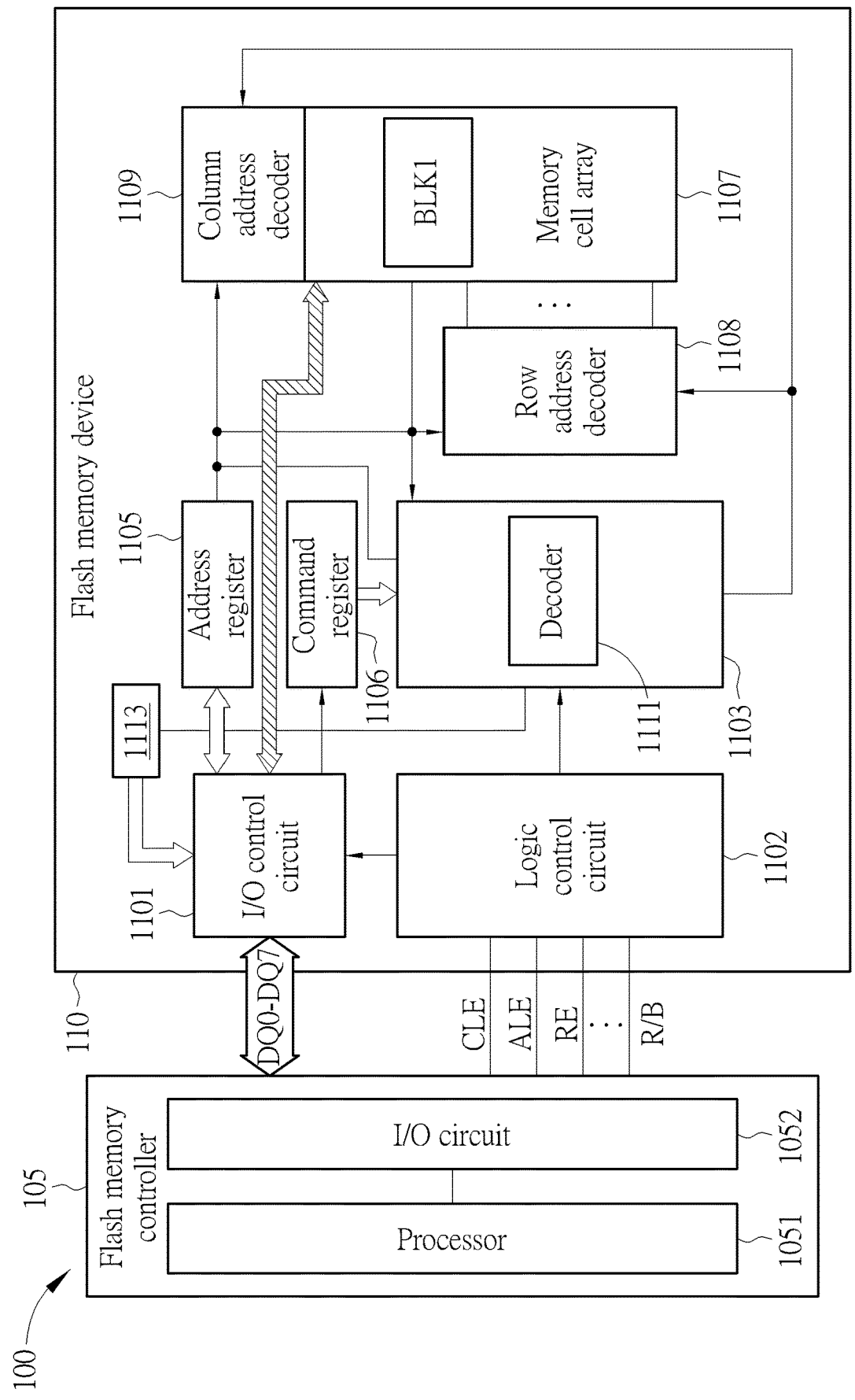
FIG. 1 is a diagram of an example of a storage device comprising a flash memory controller and a flash memory device such as an NAND-type flash memory device including multiples chips/dies according to an embodiment of the invention.

FIG. 1 is a diagram of an example of a storage device 100 comprising a flash memory controller 105 and a flash memory device 110 such as an NAND-type flash memory device including multiples chips/dies according to an embodiment of the invention. The flash memory controller 105 at least comprises a processor 1051 and an input/output (I/O) circuit 1052. The processor 1051 is coupled to the I/O circuit 1052 and is arranged to control the I/O circuit 1052 sending access (e.g. read, write/program, cache program, or erase) command signals/sequences through a specific communication interface to the flash memory device 110 to control and access the flash memory device 110.

The flash memory device 110 comprises an I/O control circuit 1101, a logic control circuit 1102, a control circuit 1103 having a decoder 1111, an address register 1105, a command register 1106, a memory cell array 1107, a row address decoder 1108, a column address decoder 1109, and a status register 1113. The decoder 1111 for example (but not limited) is an LDPC (Low-density parity-check code) decoder circuit.

The flash memory controller 105 is coupled to the flash memory device 110 through the specific communication interface and controls or accesses the flash memory device 110 by sending one or more commands into the flash memory device 110. The specific communication interface for example comprises at least signal ports/pins such as data pins DQ0-DQ7 or other data pins (not shown in FIG. 1), and logic control pins such as CLE (Command Latch Enable), ALE (Address Latch Enable), RE (Read Enable), and other logical control pins such as a ready/busy (R/B) pin. The data pins DQ0-DQ7 are coupled to the I/O control circuit 1101, and the logic control pins are coupled to the logic control circuit 1102. The memory cell array 1107 has two or more planes (not shown in FIG. 1).

In practice, when the flash memory controller 105 sends command data of a command signal, the flash memory controller 105 (or processor 1051) controls the signal of the pin ALE at a low level and controls the signal of the pin CLE at a high level so that the flash memory device 110 can know that the data received via the pins DQ0-DQ7 is command data and then can store the received command data into the command register 1106 through the I/O control circuit 1101. Similarly, when the flash memory controller 105 sends address data, the flash memory controller 105 controls the signal of the pin ALE at the high level and controls the signal of the pin CLE at the low level so that the flash memory device 110 can know that the data received via the pins DQ0-DQ7 is address data and then can store the received address data into the address register 1105 through the I/O control circuit 1101. The operations associated with the pin RE and/or other pins (not shown in FIG. 1) are not detailed for brevity.

In addition, the control circuit 1103 can control at least one address decoder such as the row address decoder 1108 and the column address decoder 1109 to control the memory cell array 1107 performing an access operation such as a read operation, a program operation, a cache program operation, or an erase operation according to the received address(es) buffered by the address register 1105 and the received command(s) buffered by the command register 1106.

When an SPOR (suddenly power off recovery) event occurs, the power provided for the storage device 100 is suddenly turned off without warning and then turned on again, and the flash memory controller 105 (or processor 1051) needs to know and find the position (e.g. address/index) of the last one accessed data unit, e.g. the last one data page, before the power is suddenly powered off. For example, if the flash memory controller 105 (or processor 1051) controls the flash memory device 110 performing a data write operation (e.g. a sequential page write operation) upon a specific block of the flash memory device 110, the flash memory device 110 may sequentially write and store a sequence of data into page units in the specific block, wherein the page units may mean logical page units having consecutive logical page addresses in the specific block. When the SPOR event occurs, the last one accessed data page in the specific block or its next logical page unit (i.e. the first one non-accessed empty page in the specific block) can be used to indicate or represent a boundary position (or a boundary page position) between data pages and non-accessed empty pages within the specific block.

The flash memory controller 105 (or its processor 1051) can send a specific boundary check command signal and/or a specific boundary check set-feature signal to the flash memory device 110 via the specific communication interface, and then the flash memory device 110 (or the control circuit 1103 controlling at least one address decoder and the decoder 1111) can searching for and finding a boundary page position within the specific block by reading page units of the specific block for one time or for multiple times.

Further, the flash memory controller 105 (or its processor 1051) can send a specific boundary report command signal and/or a specific boundary report get-feature signal to the flash memory device 110 via the specific communication interface, and then the flash memory device 110 (or the control circuit 1103 controlling status register 1113 and I/O control circuit 1101) can report or transmit the found boundary page position back to the flash memory controller 105 after searching for, finding, and determining the boundary page position within the specific block.

In practice, the flash memory controller 105 (or the flash memory device 110) may comprise two modes. In a first mode, the flash memory controller 105 (or the processor 1051) can send a single-page check command signal to the flash memory device 110 to control and make the flash memory device 110 report and transmit corresponding page data content of a single page unit indicated by the single-page check command signal to the flash memory controller 105, and the flash memory controller 105 (or the processor 1051) checks the corresponding page data content to determine whether the single page unit is an empty page.

In a second mode, as mentioned in the previous paragraph, the flash memory controller 105 (or its processor 1051) can send the specific boundary check command and/or the specific boundary check set-feature signal to the flash memory device 110 via the specific communication interface, and the flash memory device 110 can searching for and finding the boundary page position within the specific block by reading page units of the specific block for one time or multiple times. That is, in the second mode, the flash memory controller 105 (or the processor 1051) can control the flash memory device 110 automatically checking whether multiple logical page units are empty pages and transmit a resultant report to the flash memory controller once the last one page unit written by the flash memory device 110 is found.

Figure 2:
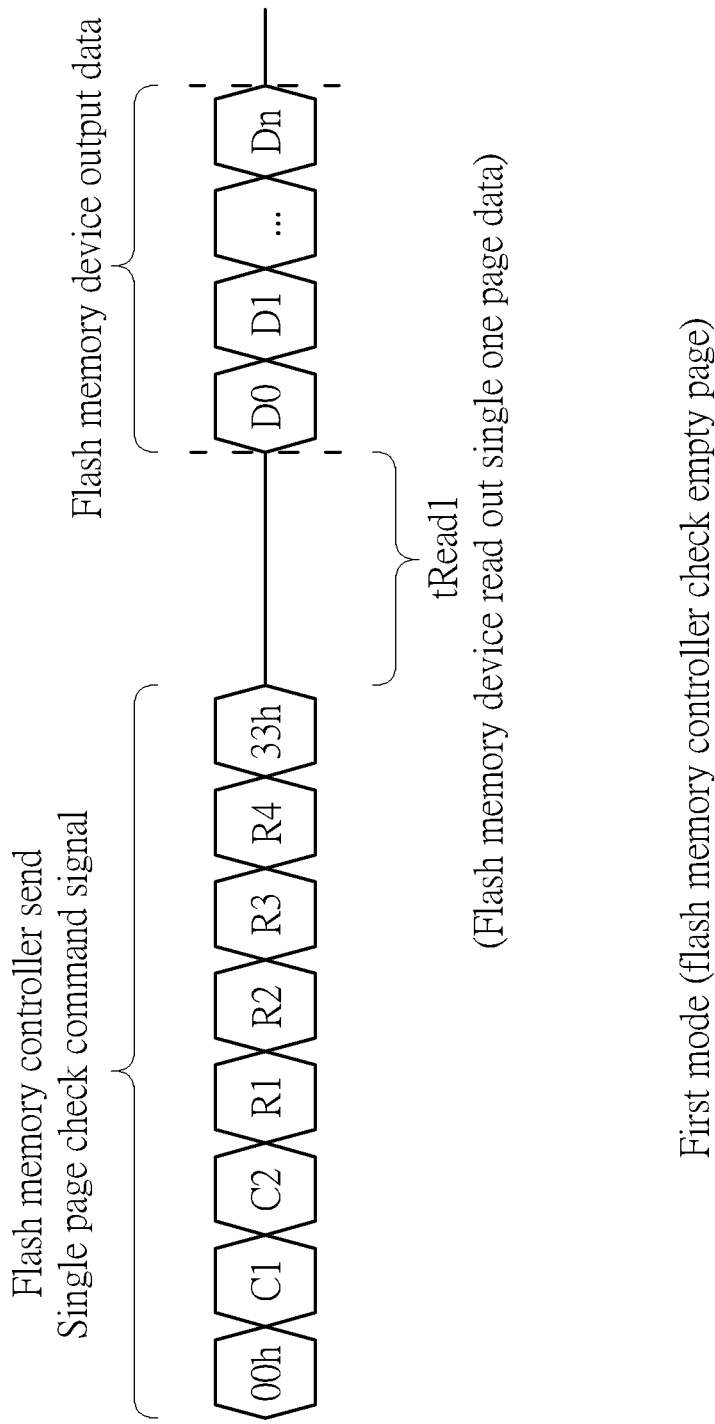
FIG. 2 is a diagram showing an example of the flash memory controller sending a single-page check command signal to the flash memory device according to an embodiment of the invention.

FIG. 2 is a diagram showing an example of the flash memory controller 105 sending a single-page check command signal to the flash memory device 110 according to an embodiment of the invention. In FIG. 2, the single-page check command signal may sequentially carry/comprise a prefix command such as 00h (i.e. 0x00, 'h' means this value is a hexadecimal value), column address (C1 and C2), row address (R1, R2, R3, and R4), and a single-page check confirm command such as 33h. The column address and row address for example are formed by 6 bytes (but not limited) and can be used to indicate a block address, a page address, and a plane/die address. The column address and row address are stored into the address register 1105 through the I/O control circuit 1101, and the prefix command 00h and single-page check confirm command such as 33h are stored into the command register 1106.

After receiving and storing the single-page check confirm command 33h into the command register 1106, the flash memory device 110 (or control circuit 1103) controls the column address decoder 1109 based on the column address and controls the row address decoder 1108 based on the row address to access or read out a single page data of a page unit in a block at a plane within the memory cell array 1107. The read single page data is outputted to the I/O control circuit 1101.

In FIG. 2, tRead1 means the total time period of reading out a single page data from the memory cell array 1107 into the I/O control circuit 1101. After the read single page data is outputted to the I/O control circuit 1101, the I/O control circuit 1101 then outputs and transmits the single page data to the flash memory controller 105 via the specific communication interface, and D0, D1, . . . , Dn means the output of the single page data. Thus, after receiving data content of the single page data, the flash memory controller 105 (or processor 1051) can check the read single page data to determine whether the read single page data is empty so as to decide the page unit is an empty page or not. That is, in the first mode, the operation of checking and determining whether a page unit is an empty page is performed by the flash memory controller 105 by itself, and the flash memory device 110 is merely used to output and transmit the content of the page data without checking and determining whether the page unit is an empty page. It should be noted that the number of bytes of row address and/or column address can be different in other embodiments.

Figure 3:
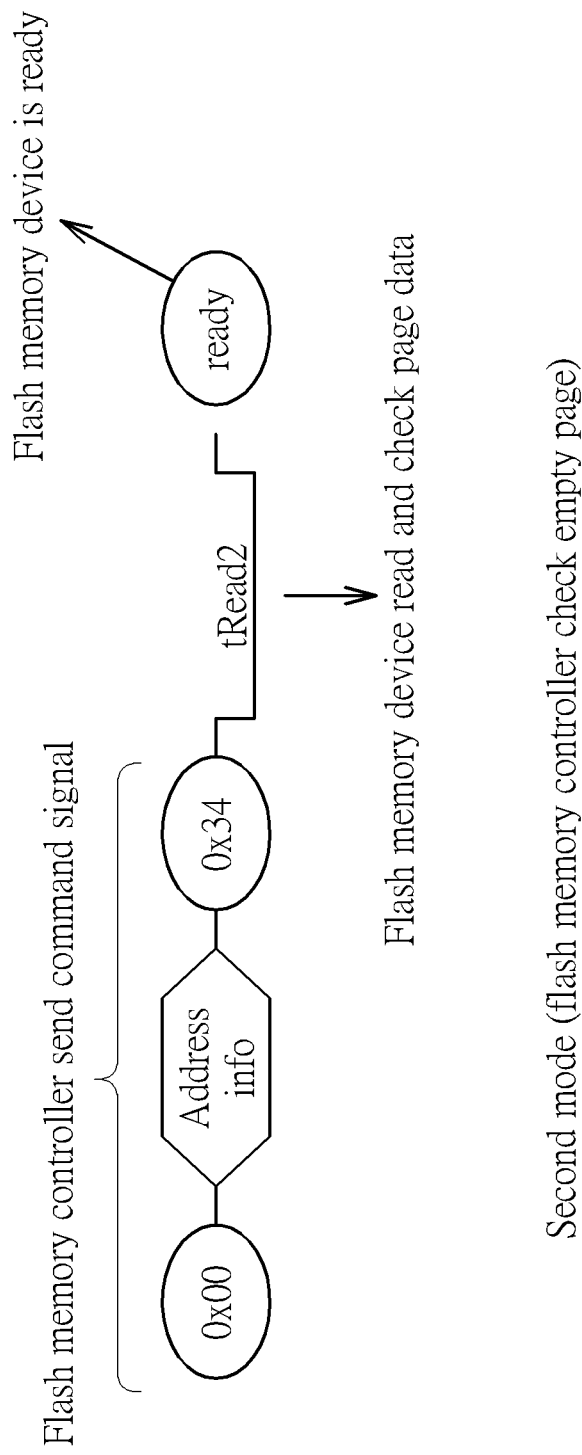
FIG. 3 is a diagram showing an example of the flash memory controller sending a specific boundary check command signal to the flash memory device according to an embodiment of the invention.

FIG. 3 is a diagram showing an example of the flash memory controller 105 sending a specific boundary check command signal to the flash memory device 110 according to an embodiment of the invention. In FIG. 3, the specific boundary check command signal may sequentially carry/comprise a boundary check prefix command such as 0x00 (i.e. 00h in which 'h' means this value is a hexadecimal value), specific address information, and a boundary check confirm command such as 0x34 (i.e. 34h different from the single-page check confirm command 33h). The specific address information at least indicates a specific block address (or called a block index) or a combination of the specific block address with one page address (or called a page index) wherein the page address is reserved and thus can be optional. Thus, the data length/bytes of the specific address information may be smaller than that of the row and column addresses in the first mode.

In FIG. 3, similarly, the specific address information is stored into the address register 1105 through the I/O control circuit 1101, and the boundary check prefix command 0x00 and boundary check confirm command 0x34 are stored into the command register 1106. After receiving and storing the boundary check confirm command 0x34 into the command register 1106, the flash memory device 110 (or control circuit 1103) controls the column address decoder 1109 and row address decoder 1108 based on the specific address information to access or read out one or more page data of one or more page units in a specific block within the memory cell array 1107 one page unit by one page unit. Each time when reading out one page data of a corresponding page unit, the control circuit 1103 uses its decoder 1111 to perform a decoding operation (e.g. LDPC decoding) upon the read page data to determine whether the corresponding page unit is an empty page until the control circuit 1103 finds and determines the boundary page position between data pages and empty pages within the specific block.

After the boundary page position is found, the control circuit 1103 transmits and stores the information of the found boundary page position and the information of the flash memory device 110 being ready into the status register 1113. In FIG. 3, tRead2 means the total time period of reading out more page data from the memory cell array 1107 and determines whether the more page data are empty to find the boundary page position. After the boundary page position is outputted to the status register 1113, the flash memory device 110 becomes ready for the flash memory controller 105 so that the flash memory controller 105 (or the processor 1051) can send a polling signal to the flash memory device 110 to make the boundary page position be transferred from the status register 1113 into the I/O control circuit 1101 and then transmitted from the I/O control circuit 1101 into the flash memory controller 105 through the specific communication interface. By doing so, after receiving the boundary check confirm command 0x34, the flash memory device 110 can automatically read out at least one page data of at least one page unit of the specific block corresponding to the specific block address and check whether the at least one page unit is empty page(s).

Figure 4:
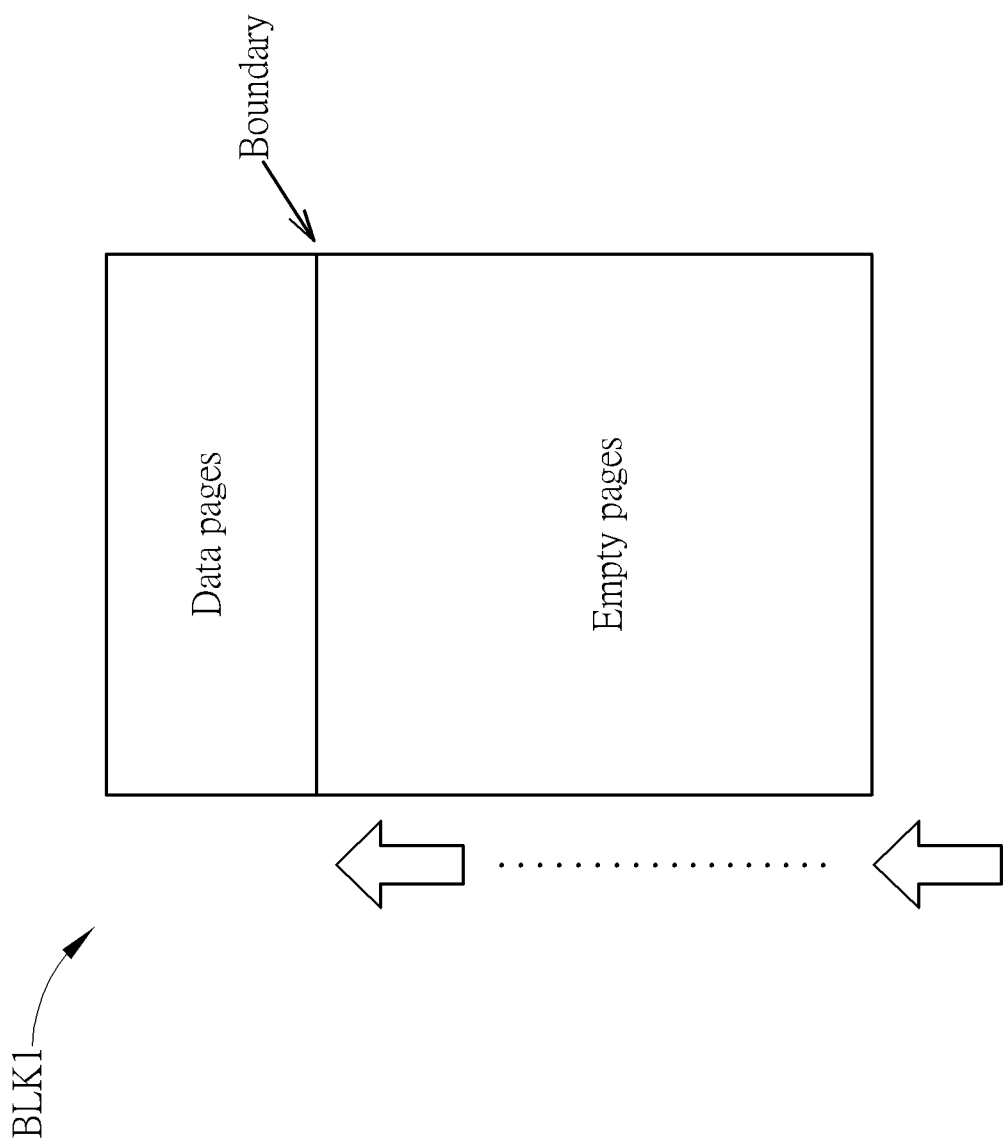
FIG. 4 is a diagram of an example of the flash memory device sequentially reading multiple consecutive logical page units of the specific block according to an embodiment of the invention.

For example (but not limited), the flash memory device 110 may sequentially read multiple consecutive logical page units of the specific block one page unit by one page unit. FIG. 4 is a diagram of an example of the flash memory device 110 sequentially reading multiple consecutive logical page units of the specific block according to an embodiment of the invention. In FIG. 4, when receiving a specific boundary check command signal sent from the flash memory controller 105, the flash memory device 110 (or control circuit 1103) at first finds and determines the specific block BLK1 as shown in FIG. 4 based on the specific block address carried by the specific boundary check command signal. Since logical page units of the specific block BLK1 is sequentially written/accessed, the flash memory device 110 (or control circuit 1103) is arranged to find and determine the boundary page position within the specific block BLK1 by sequentially checking adjacent logical page units from its bottom page unit (i.e. the last one page unit having a larger page index) to its top page unit (i.e. the first one page unit having a smaller page index such as zero) one page unit by one page unit.

For example, the specific block may comprise one hundred page units respectively corresponding to page indices ranging from 0 to 99; i.e. its top page index is 0 and its bottom page index is 99. The flash memory device 110 (or control circuit 1103) is arranged to read the last one page unit having the page index 99 to determine whether the read page unit is empty. If the read page unit having the index 99 is empty, the flash memory device 110 (or control circuit 1103) then read an upper page unit having the page index 98 to determine whether the read page unit is empty or not. The flash memory device 110 (or control circuit 1103) performs similar operations until the flash memory device 110 (or control circuit 1103) read a page unit that is not empty, wherein the page unit is determined as the last one page unit written by the flash memory device 110 before the power is suddenly powered off.

By doing so, the flash memory device 110 (or control circuit 1103) can finally find and determine a page index of the first one page unit among the empty pages (i.e. the top page unit among the empty pages in FIG. 4), and also finds and determines a page index of a correspondingly previous page unit (i.e. the bottom page unit among the data pages in FIG. 4) wherein the correspondingly previous page unit is the last one page unit written by the flash memory device 110 before the power is suddenly powered off. Either the page index of the first one page unit among the empty pages or the page index of the correspondingly previous page unit (i.e. the bottom page unit among the data pages) can be used as the boundary page position.

Figure 5:
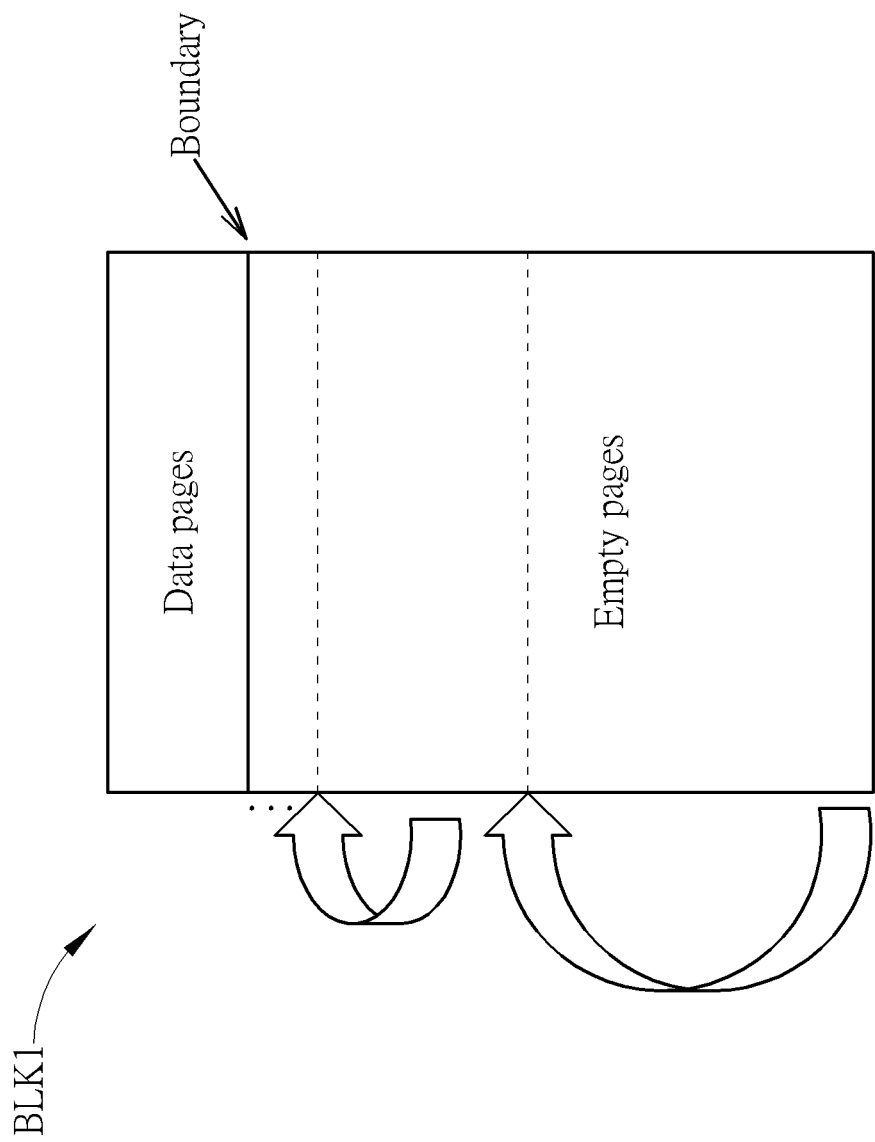
FIG. 5 is a diagram of an example of the flash memory device jumping to read non-consecutive logical page units of the specific block according to an embodiment of the invention.

In one embodiment, for example (but not limited), the flash memory device 110 may skip some logical page units of the specific block to find the boundary page position. FIG. 5 is a diagram of an example of the flash memory device 110 jumping to read non-consecutive logical page units of the specific block according to an embodiment of the invention. In FIG. 5, when receiving a specific boundary check command signal sent from the flash memory controller 105, the flash memory device 110 (or control circuit 1103) at first finds and determines the specific block BLK1 as shown in FIG. 5 based on the specific block address carried by the specific boundary check command signal. Then, the flash memory device 110 (or control circuit 1103) is arranged to find and determine the boundary page position within the specific block BLK1 by setting and using a top position, a center position, and a bottom position for the specific block BLK1, and then adjusting and calculating these positions based on a successive approximation method until the boundary page position is determined.

For example (but not limited), initially, for the first round, the top position, center position, and the bottom position for the specific block BLK1 can be configured as 0, 49, and 99, respectively, if the specific block BLK1 has the logical page units corresponding to page indices ranging from 0 to 99. Then the flash memory device 110 (or control circuit 1103) checks whether a logical page unit having the page index 49 is an empty page unit or not. If this is an empty page unit, then the flash memory device 110 (or control circuit 1103) can know that the boundary page position should be in the page index range from 0 to 49, and is arranged to re-configure the top position, center position, and the bottom position for the specific block BLK1 as 0, 24, and 49, for the second round. Then the flash memory device 110 (or control circuit 1103) checks whether a logical page unit having the page index 24 is an empty page unit or not. If this is an empty page unit, then the flash memory device 110 (or control circuit 1103) can know that the boundary page position should be in the page index range from 0 to 24, and is arranged to re-configure the top position, center position, and the bottom position for the specific block BLK1 as 0, 12, and 24, for the third round.

Similarly, the flash memory device 110 (or control circuit 1103) checks whether a logical page unit having the page index 12 is an empty page unit or not. If this is not an empty page unit, then the flash memory device 110 can know that the boundary page position should be in the page index range from 12 to 24, and is arranged to re-configure the top position, center position, and the bottom position for the specific block BLK1 as 12, 18, and 24, for the next round. The flash memory device 110 (or control circuit 1103)) performs the above operations until the boundary page position is determined. Also, by doing so, the flash memory device 110 (or control circuit 1103) can finally find and determine a page index of the first one page unit among the empty pages (i.e. the top page unit among the empty pages in FIG. 5), and also finds and determines a page index of a correspondingly previous page unit (i.e. the bottom page unit among the data pages in FIG. 5) wherein the correspondingly previous page unit is the last one page unit written by the flash memory device 110 before the power is suddenly powered off. Either the page index of the first one page unit among the empty pages or the page index of the correspondingly previous page unit (i.e. the bottom page unit among the data pages) can be used as the boundary page position.

It should be noted that, in the embodiments of FIG. 4 and FIG. 5, the operation of finding and determining the boundary page position in the specific block BLK1 is executed by the flash memory device 110 (or the control circuit 1103), rather than the flash memory controller 105. Thus, this does not consume and occupy the computation capability of the flash memory controller 105.

Further, in one embodiment, the above-mentioned address information may comprise only block address information of the specific block. In other embodiment, the above-mentioned address information may comprise the block address information and a page address information, and the flash memory device 110 (or control circuit 1103) can ignore or discard the page address information included within the address information when receiving the boundary check command signal carrying such address information. Thus, the address information may be implemented by different data lengths, e.g. 5 bytes, 6 bytes, or more bytes (but not limited).

Figure 6:
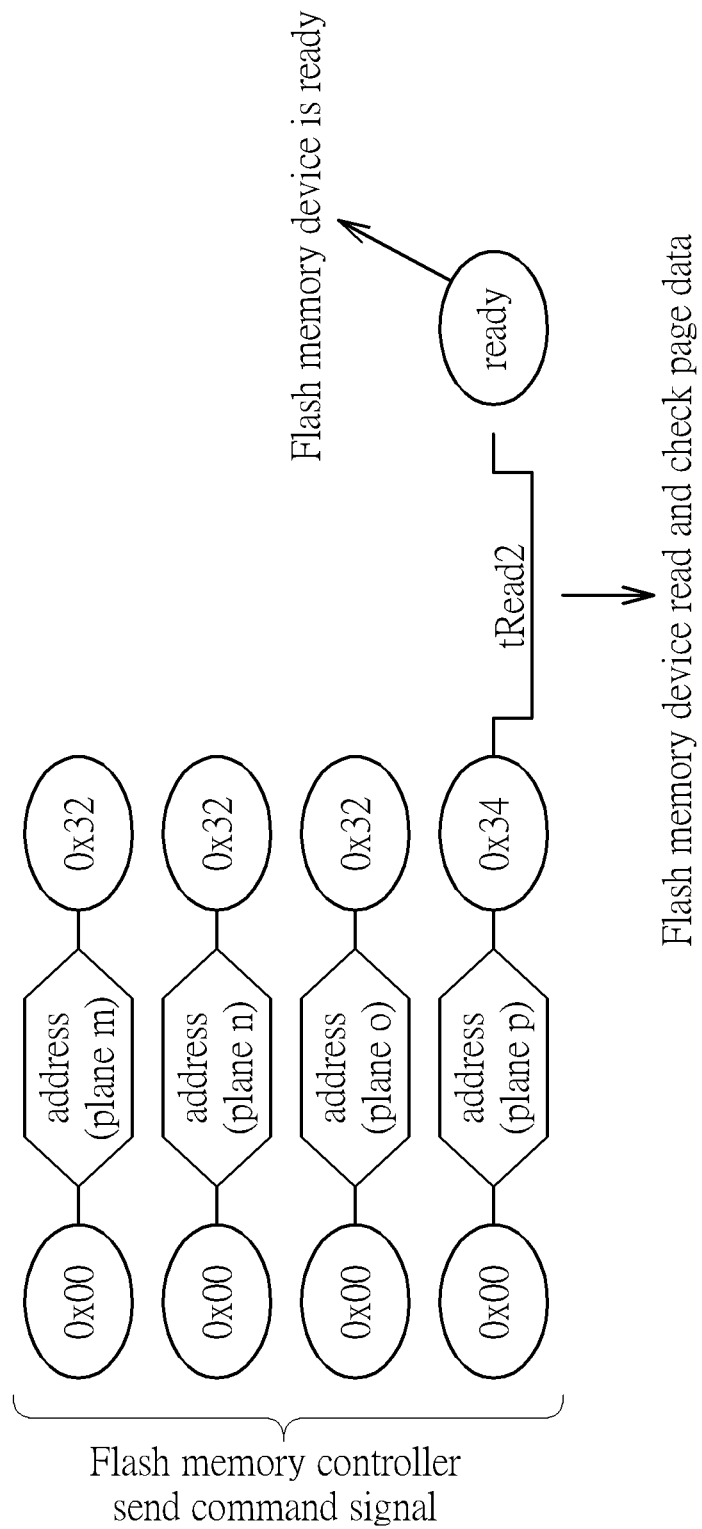
FIG. 6 is a diagram showing an example of the flash memory controller sequentially sending multiple specific boundary check command signals to the flash memory device according to an embodiment of the invention.

FIG. 6 is a diagram showing an example of the flash memory controller 105 sequentially sending multiple specific boundary check command signals to the flash memory device 110 according to an embodiment of the invention. In this embodiment, a first boundary check command signal sequentially comprises a boundary check prefix command such as 0x00, a first address information corresponding to a first plane such as the m-th plane, and an intermediate command such as 0x32 (but not limited), wherein the first address information at least indicates a specific block address/index or a combination of the specific block address/index with one page address/index for the m-th plane. A second boundary check command signal sequentially comprises a boundary check prefix command such as 0x00, a second address information corresponding to a second plane such as the n-th plane, and an intermediate command such as 0x32, wherein the second address information at least indicates a specific block address/index or a combination of the specific block address/index with one page address/index for the n-th plane. A third boundary check command signal sequentially comprises a boundary check prefix command such as 0x00, a third address information corresponding to a third plane such as the o-th plane, and an intermediate command such as 0x32, wherein the third address information at least indicates a specific block address/index or a combination of the specific block address/index with one page address/index for the o-th plane. A fourth boundary check command signal sequentially comprises a boundary check prefix command such as 0x00, a fourth address information corresponding to a fourth plane such as the p-th plane, and a boundary check confirm command such as 0x34, wherein the fourth address information at least indicates a specific block address/index or a combination of the specific block address/index with one page address/index for the p-th plane.

Similarly, after receiving the multiple boundary check command signals, the flash memory device 110 is arranged to read out page data of one or more page units of the four blocks respectively at the four different planes based on the designated block addresses and to check whether the page units are empty pages or not. The check operation is similar and not detailed for brevity. Further, the multiple different blocks may form a super block. This is not meant to be a limitation.

Figure 7:
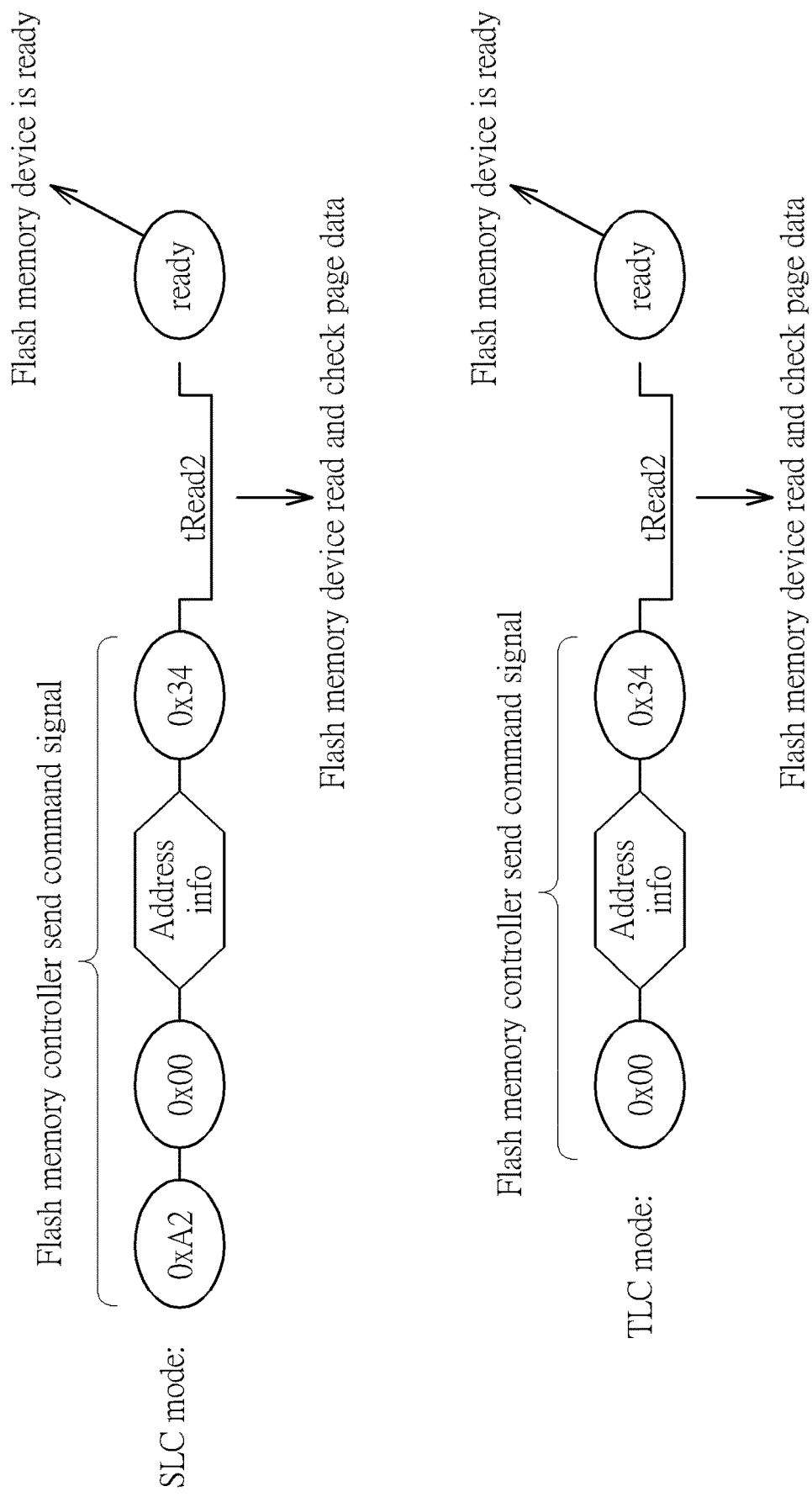
FIG. 7 is a diagram of the examples of the flash memory controller sending different specific boundary check command signals to the flash memory device for the SLC mode and TLC mode respectively according to an embodiment of the invention.

In other embodiments, the format of the specific boundary check command signal can be applied into embodiments of different program/write modes such as SLC (single-level-cell) mode and TLC (triple-level-cell) mode. FIG. 7 is a diagram of the examples of the flash memory controller 105 sending different specific boundary check command signals to the flash memory device 110 for the SLC mode and TLC mode respectively according to an embodiment of the invention. In this embodiment, for the SLC mode, a first specific check command signal sequentially comprises an SLC mode indication command such as 0xA2 (but not limited), a boundary check prefix command such as 0x00, specific address information, and a boundary check confirm command such as 0x34. The SLC mode indication command 0xA2 is used to indicate that the specific boundary check command signal is used for the SLC mode in which the flash memory device is arranged to check whether page unit(s) of an SLC block is/are empty page(s) when receiving the specific boundary check command signal. Also, the specific address information at least indicates a specific SLC block address/index of the SLC block or a combination of the specific SLC block address/index with one page address/index. This is not meant to be a limitation.

In this embodiment, for the TLC mode, a second boundary check command signal sequentially comprises a boundary check prefix command such as 0x00, specific address information, and a boundary check confirm command such as 0x34, without an SLC mode indication command such as 0xA2. Based on the second boundary check command signal excluding the SLC mode indication command 0xA2, the flash memory device 110 can be arranged to check whether page unit(s) (i.e. upper/center/lower page unit(s)) of a TLC block is/are empty page(s) when receiving the second boundary check command signal. Also, the specific address information at least indicates a specific block address/index of the TLC block or a combination of the specific block address/index with one page address/index. This is not meant to be a limitation.

In the embodiments of FIG. 3, FIG. 6, and FIG. 7, after receiving a boundary check command signal sent from the flash memory controller 105, the flash memory device 110 may need to consume a time period tRead2 that will be varied under different situations, to finally find that last one page unit that is accessed/written by the flash memory device 105 before the power is suddenly powered off. Due to this, the flash memory controller 105 (or the processor 1051) is arranged to performing a polling operation to poll the state of the flash memory device 110 by checking the status register 1113 within the flash memory device 110 to determine whether the status register 1113 records the information that the flash memory device 110 is or has been ready. Further, in other embodiment, the flash memory controller 105 (or the processor 1051) may be arranged to check the state of the R/B pin (or signal port) of the specific communication interface to determine whether the flash memory device 110 is or has been ready. For example, when the R/B pin is at a low logic level, this may indicates that the flash memory device 110 is busy. When the R/B pin is at a high logic level, this may indicates that the flash memory device 110 is ready (e.g. an idle state). This is not meant to be a limitation of the invention.

Figure 8:
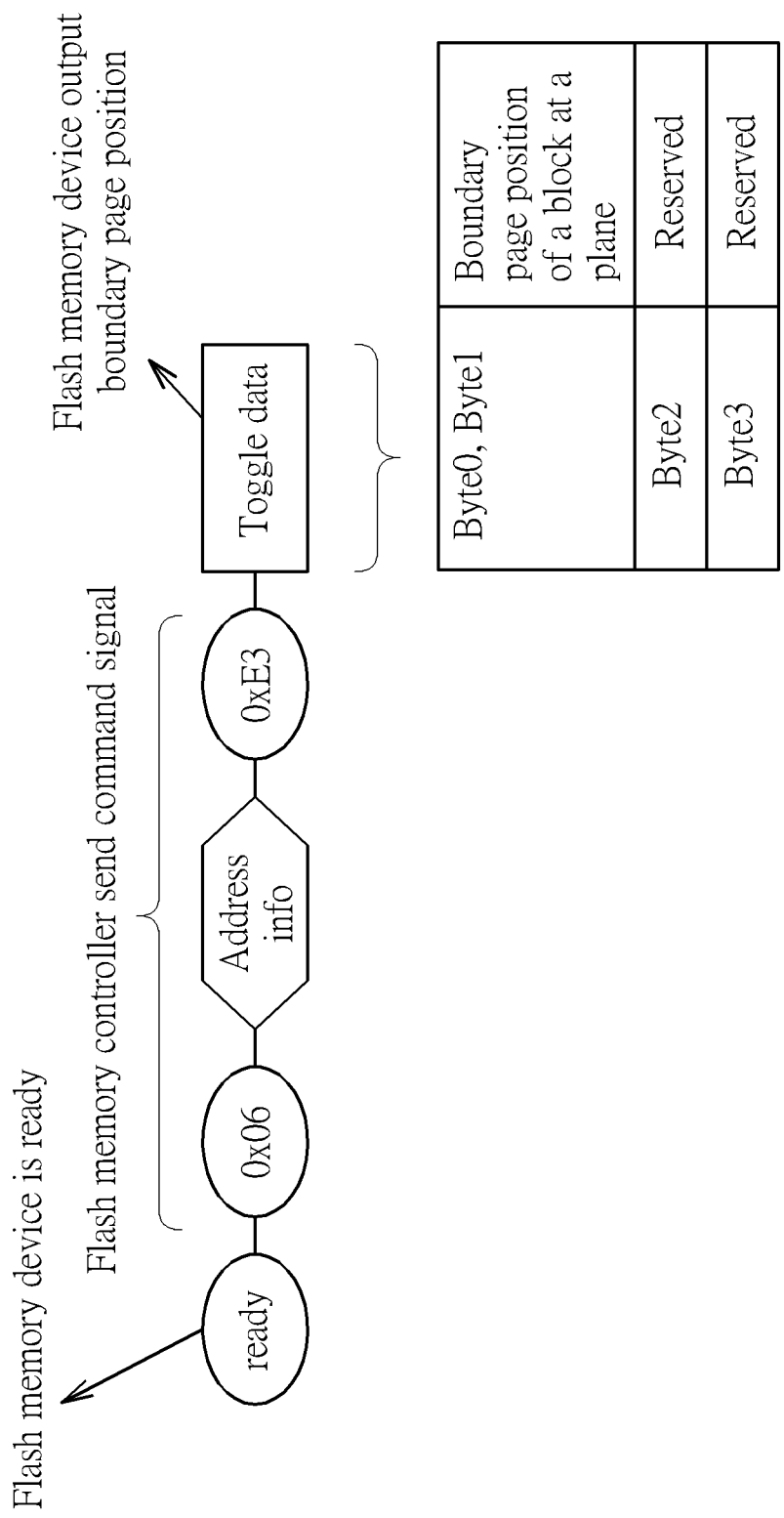
FIG. 8 is a diagram of an example format of the boundary position report command signal according to an embodiment of the invention.

After the flash memory controller 105 (or the processor 1051) determines that the flash memory device 110 is ready, the flash memory controller 105 (or the processor 1051) can send a boundary report command signal to the flash memory device 110 via the specific communication interface to ask/control the flash memory device 110 outputting the found boundary page position. FIG. 8 is a diagram of an example format of the boundary position report command signal according to an embodiment of the invention. In FIG. 8, the boundary position report command signal, sent by the flash memory controller 105, may sequentially comprise a boundary report prefix command such as 0x06, a specific address information, and a boundary report confirm command such as 0xE3. After receiving the boundary report confirm command 0xE3 of such boundary position report command signal, the flash memory device 110 (or I/O control circuit 1101) reports or transmits toggle data to the flash memory controller 105 via the specific communication interface, wherein the transmitted toggle data for example comprises multiple bytes in which a first byte Byte0 and a second byte Byte1 may be used to indicate the boundary page position (i.e. the page position/index of a first one empty page unit of the specific block or the page position/index of the last one data page unit of the specific block), and the other bytes Byte2 and Byte3 may be reserved or optional. In other embodiments, the other bytes of the toggle data may be used to indicate other different information.

Figure 9:
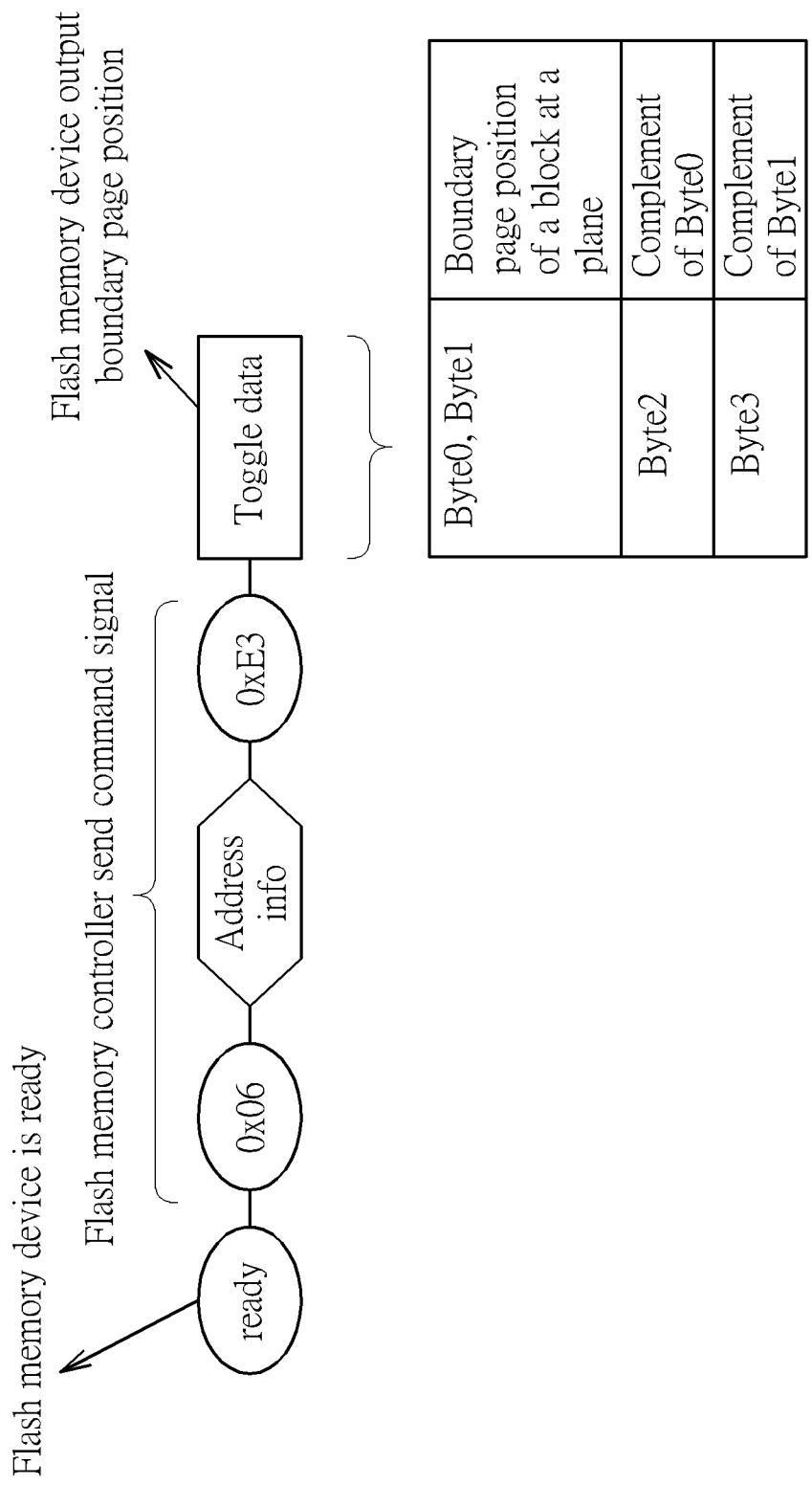
FIG. 9 is a diagram of an example format of the boundary position report command signal according to another embodiment of the invention.
Figure 10:
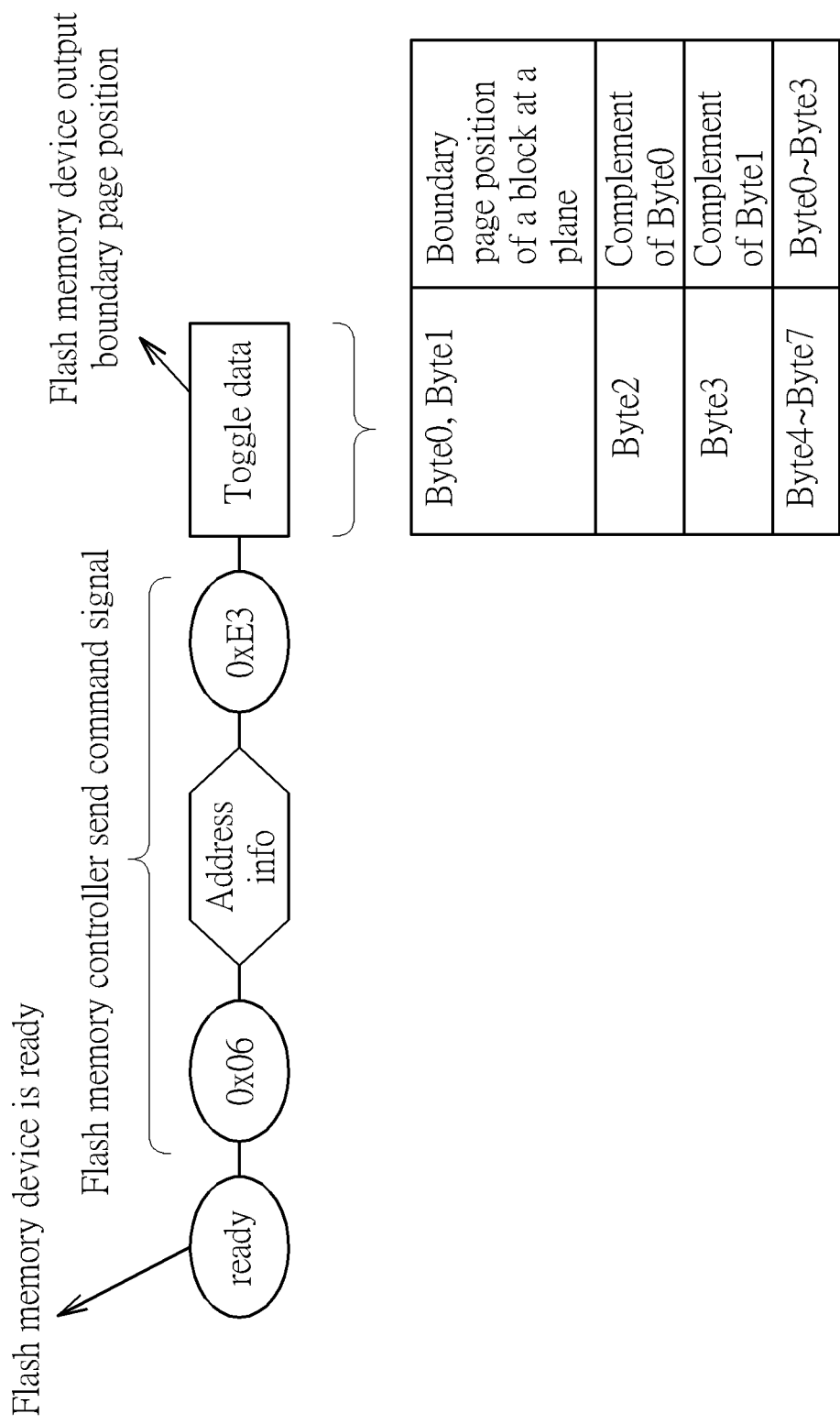
FIG. 10 is a diagram of an example format of the boundary position report command signal according to another embodiment of the invention.

Further, in one embodiment, the third byte Byte2 of the toggle data can be used to indicate a complement value of the value indicated by the first byte Byte0, and the fourth byte Byte3 of the toggle data can be used to indicate a complement value of the value indicated by the second byte Byte1, as shown in FIG. 9. In other embodiments, the toggle data may comprise eight bytes in which a group of four bytes Byte0-Byte3 can be used to indicate the value of the boundary page position and the complement value of the value of the boundary page position while a second group of different four bytes Byte4-Byte7 can be used to transmit the same contents identical to the first group of four bytes Byte0-Byte3, as shown in FIG. 10. In one embodiment, the second group of different four bytes may be used to indicate the other resultant values. The modifications fall within the scope of the invention.

Figure 11:
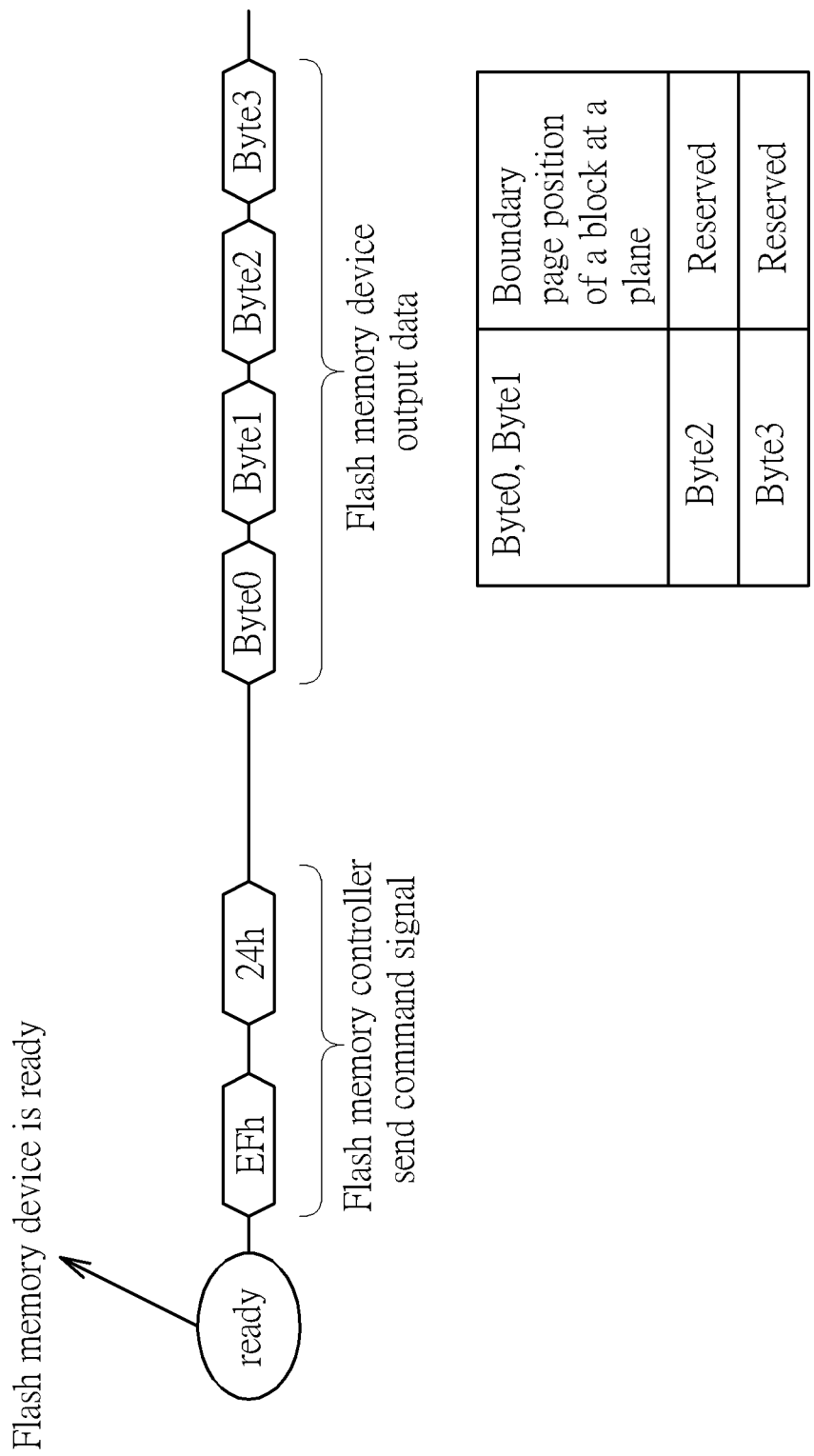
FIG. 11 is a diagram of an example format of a specific boundary report get-feature signal according to an embodiment of the invention.

Further, in other embodiments, the flash memory controller 105 (or the processor 1051) can send a specific boundary report get-feature signal to the flash memory device 110 to ask or control the flash memory device 110 transmitting the information of the boundary page position in the specific block back to the flash memory controller 105. FIG. 11 is a diagram of an example format of a specific boundary report get-feature signal according to an embodiment of the invention. In FIG. 11, the boundary report get-feature signal, sent by the flash memory controller 105, is transmitted after the flash memory device 110 becomes ready and it may sequentially comprise a get-feature command such as EEh (but not limited) and a boundary report feature address which can be implemented by using one-cycle address such as one byte (but not limited), e.g. 24h (i.e. 0x24) corresponding to one plane such as a specific plane. The value of the boundary report feature address can be set as different values, e.g. 25h, 26h, or 27h, to respectively indicate different planes. For example, the flash memory device 110 may have four planes having plane numbers ranging from 0 to 3, and the values of the feature address for the four planes can be 24h, 25h, 26h, and 27h, respectively. By doing so, when receiving a boundary report get-feature signal carrying a get-feature command EEh and the feature address 24h sent from the flash memory controller 105, the flash memory device 110 (or control circuit 1103) can control the status register 1113 outputting and transmitting the information of the boundary page position of one block at the plane having the plane number 0, i.e. the four bytes Byte0-Byte3, into the I/O control circuit 1101 immediately or later, and the I/O control circuit 1101 can transmit and output the four parameter data such as four bytes Byte0-Byte3 into the flash memory controller 105 via the specific communication interface immediately or later. For example, the data outputted by the flash memory device 110 may comprise four parameter data each being implemented by one byte, and a first parameter data Byte0 with a second parameter data Byte1 can be used to indicate the position of the first empty page unit of a specific block at the first plane having plane number 0 while the other parameter data Byte2 and Byte3 can be reserved or optional. Similarly, when the received feature address indicates 25h, 26h, or 27h, the flash memory device 110 can respectively transmit the information of the boundary page position of one block at the plane having plane number 1, 2, or 3. The operations are identical and not detailed for brevity.

Figure 12:
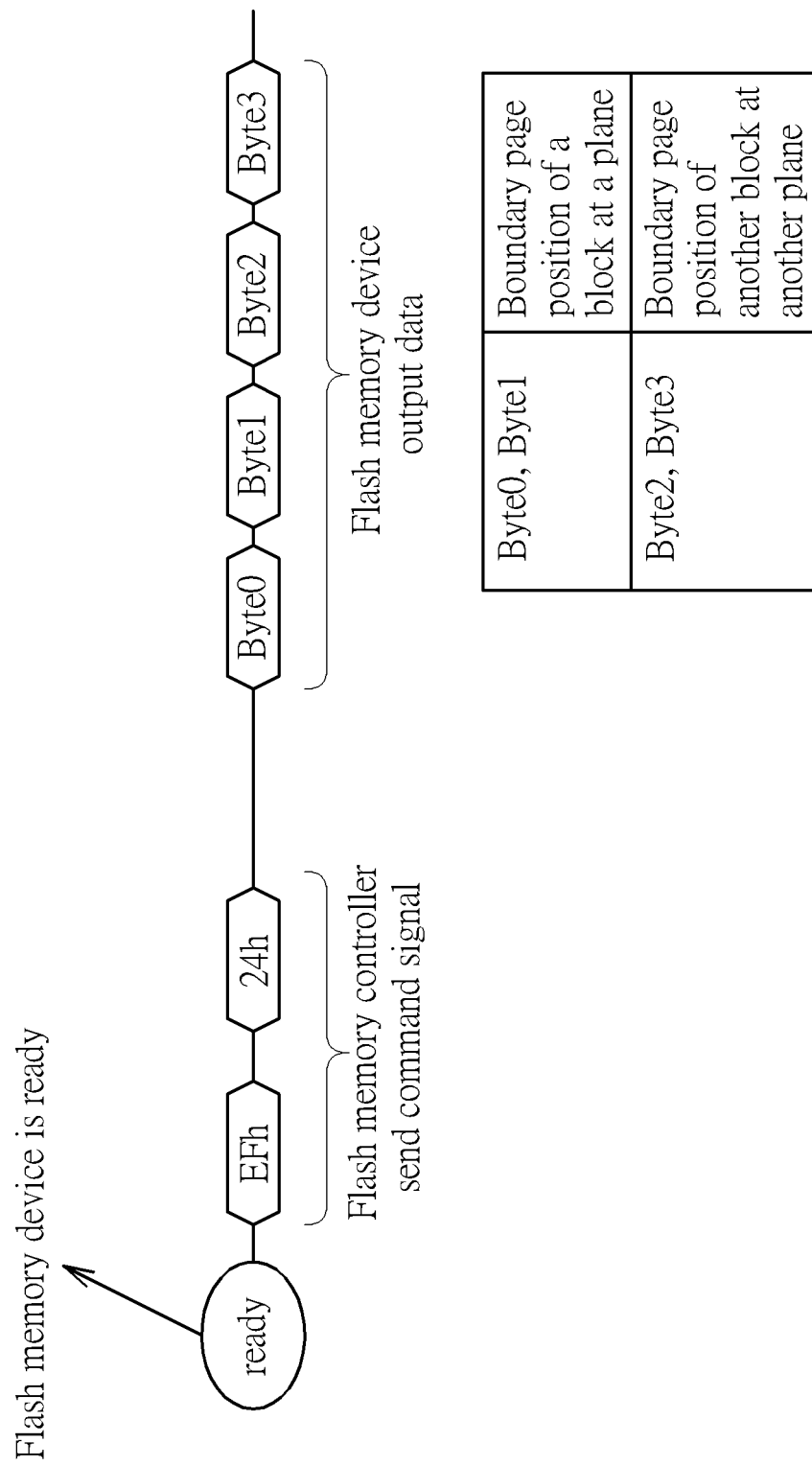
FIG. 12 is a diagram of an example format of a specific boundary report get-feature signal according to another embodiment of the invention.

FIG. 12 is a diagram of an example format of a specific boundary report get-feature signal according to another embodiment of the invention. In FIG. 12, the boundary report get-feature signal, sent by the flash memory controller 105, is transmitted after the flash memory device 110 becomes ready and it may sequentially comprise a get-feature command such as EEh (but not limited) and a boundary report feature address which can be implemented by using one-cycle address such as one byte (but not limited), e.g. 24h (i.e. 0x24) corresponding to more planes such as two different planes. The value of the boundary report feature address can be set as a different value, e.g. 25h, to indicate another two different planes. For example, the flash memory device 110 may have four planes having plane numbers ranging from 0 to 3, and the values of the feature address for the four planes can be 24h, 25h, 26h, and 27h, respectively. By doing so, when receiving a boundary report get-feature signal carrying a get-feature command EEh and the feature address 24h sent from the flash memory controller 105, the flash memory device 110 (or control circuit 1103) can control the status register 1113 outputting and transmitting the information of the boundary page position of blocks at the planes having the plane numbers 0 and 1 into the I/O control circuit 1101, and the I/O control circuit 1101 can transmit and output the boundary page positions of block at the two planes into the flash memory controller 105 via the specific communication interface. Similarly, when the received feature address indicates 25h, the flash memory device 110 can respectively transmit the information of the boundary page positions of blocks at the other two planes having plane numbers 2 and 3 into the flash memory controller 105. The operations are identical and not detailed for brevity.

Figure 13:
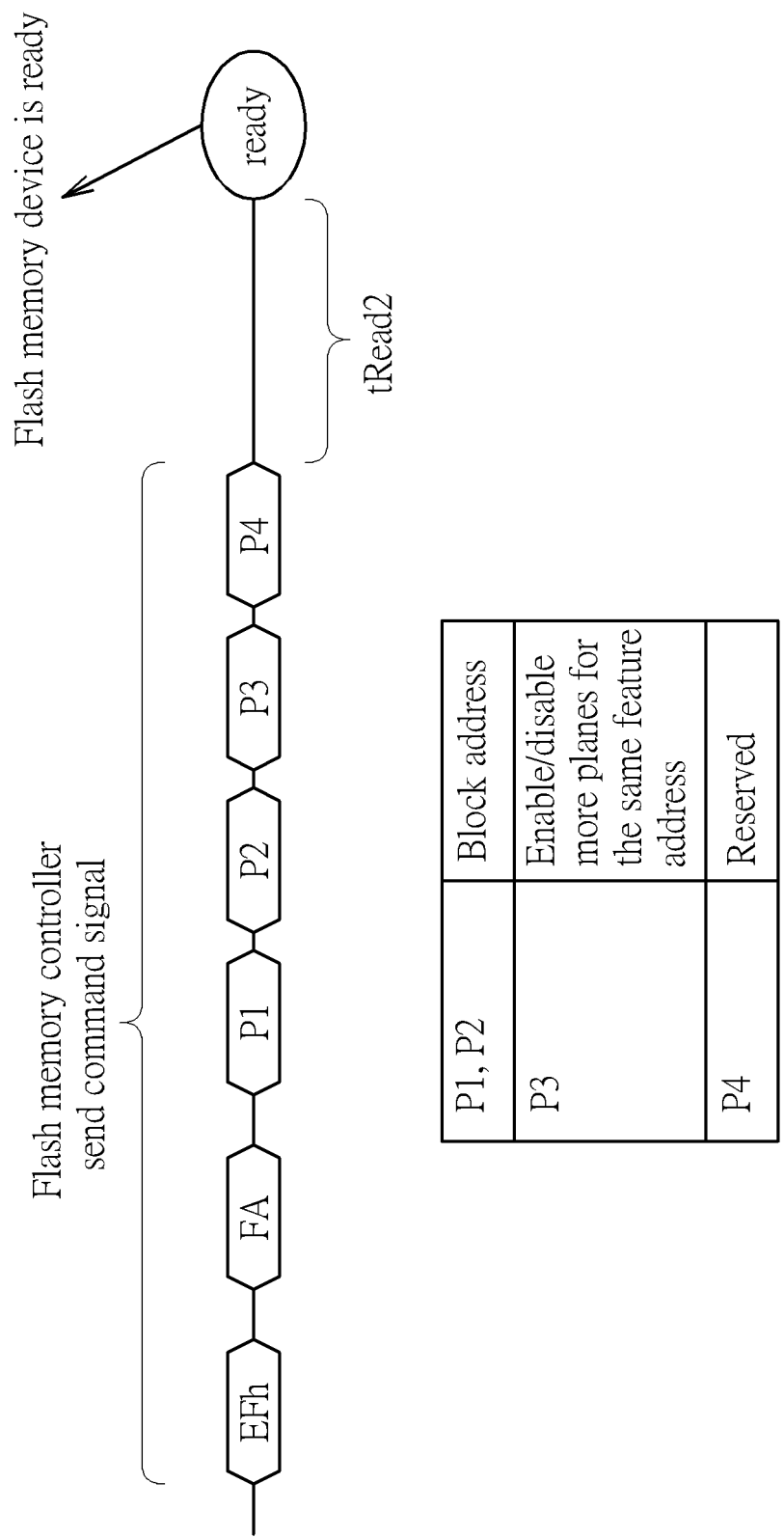
FIG. 13 is a diagram of an example format of a specific boundary check set-feature signal sent from the flash memory controller to the flash memory device via the specific communication interface according to an embodiment of the invention.

Further, in other embodiments, the flash memory controller 105 (or the processor 1051) can be arranged to send a specific boundary check set-feature signal to the flash memory device 110 so as to control the flash memory device 110 automatically checking and finding the boundary page position in a specific block. FIG. 13 is a diagram of an example format of a specific boundary check set-feature signal sent from the flash memory controller 105 to the flash memory device 110 via the specific communication interface according to an embodiment of the invention. In FIG. 13, the specific boundary check set-feature signal may sequentially comprise a set-feature command such as EFh, a specific feature address FA, and one or more parameter data such as four parameter data P1, P2, P3, and P4. The value of the specific feature address FA can be configured to be associated with and to indicate that this set-feature signal is used to control the flash memory device 110 automatically checking and finding the boundary page position in a specific block, and for example its value can be 24h (but not limited). The four parameter data P1, P2, P3, and P4 for example can be implemented by four bytes. The first and second parameter data P1 and P2 for example can be used to indicate and specify the information of a specific block address and/or the information of a specific LUN (logical unit number) or die address. The third parameter data P3 can be used to indicate whether to enable the more planes for the same feature address while the fourth parameter data P4 may be reserved. For example (but not limited), the same feature address carried in the boundary check set-feature signal is used for more or all planes if the third parameter data P3 indicates a first logic bit '1', and the same feature address carried in the boundary check set-feature signal is used for only one plane if the third parameter data P3 indicates a second logic bit '0'. By doing so, after receiving the specific boundary check set-feature signal, the flash memory device 110 can read and check page unit(s) of block(s) at multiple different planes based on the information of the specific block address so as to determine the information of the boundary page position(s). Similarly, after determining the boundary page position(s), the flash memory controller 105 (or the processor 1051) can check the status of the flash memory device 110 to determine whether the flash memory device 110 is ready or not, and to control the flash memory device 110 sending the information of boundary page position(s) to the flash memory controller 105 by either sending the boundary report command signal or sending the boundary report get-feature signal. This also falls within the scope of the invention.

Further, in other embodiments, a provided flash memory controller can be arranged to minimize or decrease a block's boundary search range that is used for finding the boundary page position by fetching or obtaining a record point which is stored in the flash memory device 110, then using the record point to obtain a decreased or smaller boundary search range, and finally controlling the flash memory device 110 searching and finding the boundary page position based on the decreased or smaller boundary search range. This can significantly decrease the total empty page search time.

Figure 14:
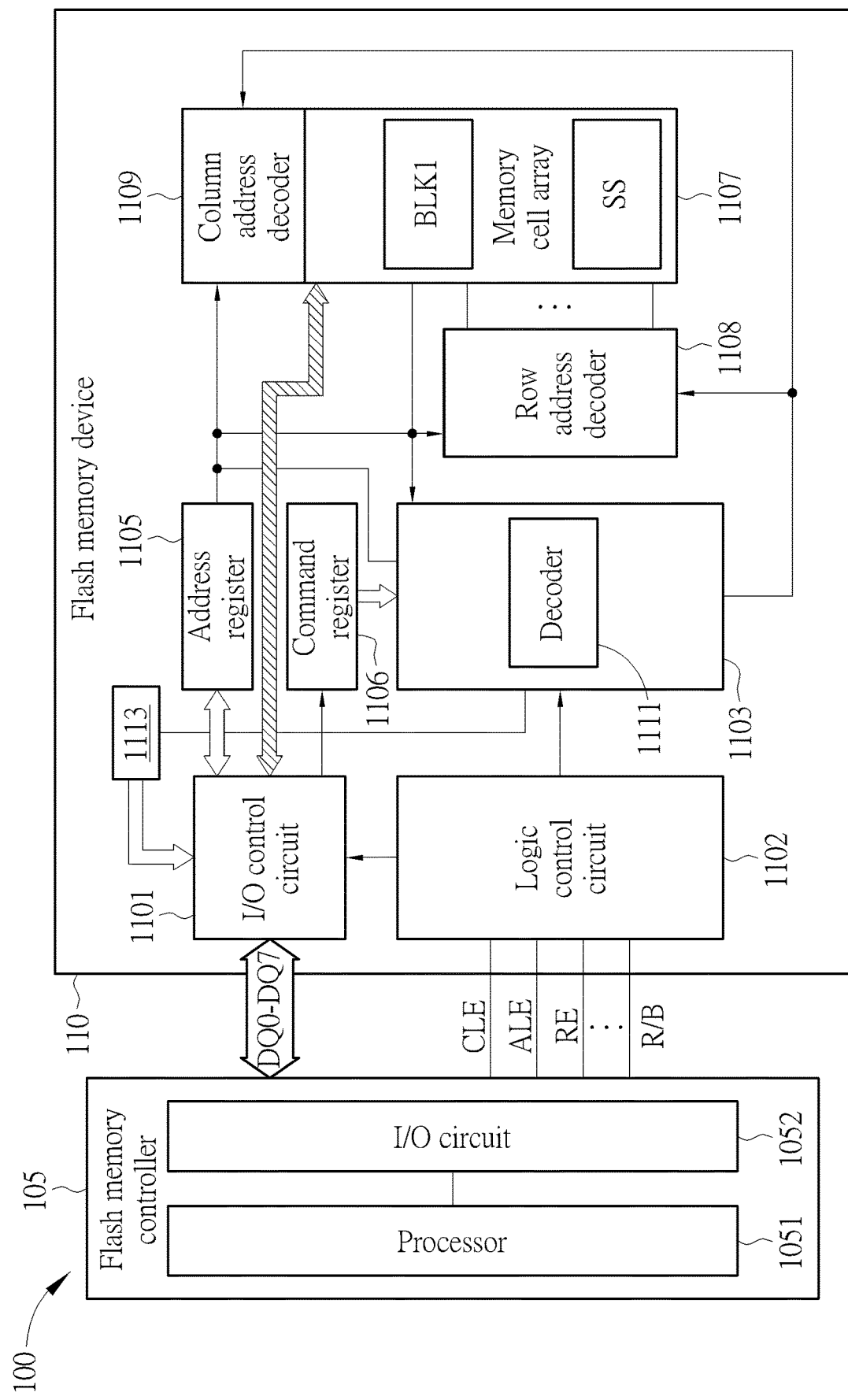
FIG. 14 is a diagram of another example of the storage device according to another embodiment of the invention.

FIG. 14 is a diagram of another example of the storage device 100 according to another embodiment of the invention. As shown in FIG. 14, a storage space SS in the memory cell array 1107 is provided and used for storing a temporary record point for the flash memory controller 105, and it can be implemented by using one or more page units of a block which may be different from the block BLK1 (but not limited). For example, when the flash memory controller 105 performs a sequential data write operation to write a sequence of page data into the flash memory device 110, the flash memory controller 105 (or the processor 1051) can control the flash memory device 110 periodically storing and updating the information of a temporary page position into the storage space SS. For instance, the flash memory device 110 may update the information of the temporary page position each time when every N consecutive page units in a specific block have been completely written and become data pages. The value of N is variable. For example (but not limited), the value of N may be 5, 10, or 20, and it may be varied in response to different operation conditions. The value of N is controlled and determined by the flash memory controller 105 (or the processor 1051), and the updated temporary page position is stored in the storage space SS as shown in FIG. 14 before the power is turned off. Thus, once an SPOR event occurs, the flash memory controller 105 (or the processor 1051) can send a signal to the flash memory device 110 to make the flash memory device 110 read the information of the updated temporary page position from the storage space SS into the I/O control circuit 1101, so that the I/O control circuit 1101 can transmit the information of the updated temporary page position into the flash memory controller 105. Then, the flash memory controller 105 (or the processor 1051) can send a specific boundary check command signal or a specific boundary check set-feature signal into the flash memory device 110 to control the flash memory device 110 using the temporary page position as a start page position to check and determine a boundary page position for a specific block. By doing so, the page search range for determining the boundary page position for the specific block can be significantly decreased or minimized.

Figure 15:
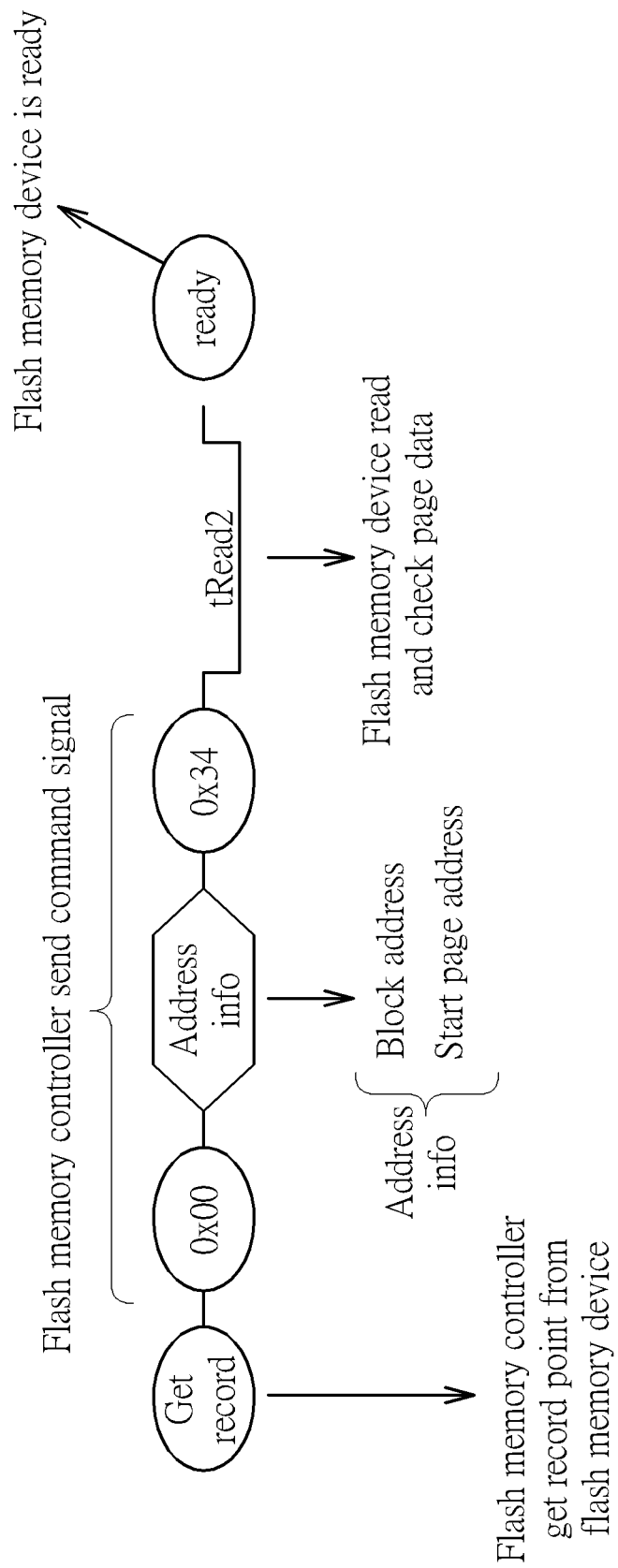
FIG. 15 is a diagram showing an example of the flash memory controller sending a specific boundary check command signal to the flash memory device according to another embodiment of the invention.

FIG. 15 is a diagram showing an example of the flash memory controller 105 sending a specific boundary check command signal to the flash memory device 110 according to another embodiment of the invention. In FIG. 15, before sending the specific boundary check command signal, the flash memory controller 105 (or the processor 1051) is arranged to control the flash memory device 110 reading the information of the updated temporary page position from the storage space SS into the I/O control circuit 1101 and transmitting the updated temporary page position (i.e. a record point) back to the flash memory controller 105, so that the flash memory controller 105 (or the processor 1051) can use the temporary page position as a start page address/index for the search range of a specific block. Then, after getting the record point, the flash memory controller 105 (or the processor 1051) sends the specific boundary check command signal which may sequentially comprise a boundary check prefix command such as 0x00 (i.e. 00h in which 'h' means this value is a hexadecimal value), specific address information, and a boundary check confirm command such as 0x34 (i.e. 34h different from the single-page check confirm command 33h), wherein the specific address information indicates a specific block address/index and the start page address/index. Similarly, after receiving and storing the boundary check confirm command 0x34 into the command register 1106, the flash memory device 110 (or control circuit 1103) controls the column address decoder 1109 and row address decoder 1108 based on the specific address information with the start page address/index to access or read out one or more page data of one or more page units in a specific block within the memory cell array 1107 one page by one page.

For example (but not limited), refer back to FIG. 4, the flash memory controller 105 (or the processor 1051) may update the record point (i.e. the temporary page position)

each time when finishing the writing of 10 page units, and the last one page unit that is written by the flash memory controller 105 may be at a page index P18 while the temporary page position may be at a page index P9. In this situation, the flash memory controller 105 (or the processor 1051) can control the flash memory device 110 setting a decreased or smaller search range which may be defined by the start page index (i.e. P9) and a range width larger than 10 page units. For instance, based on the start page index (i.e. P9), the flash memory controller 105 (or the processor 1051) may control the flash memory device 110 only searching for the page range from P9 to P19 in the specific block, so that in this example the flash memory device 110 reads and checks only two page data (i.e. page data of two pixel units corresponding to P19 and P18) and then determines the boundary page position is at the page index P18 if the flash memory device 110 is configured to sequentially read and check page data from the bottom of the decreased or smaller search range one page unit by one page unit. Compared to the example of sequentially reading and checking page data from the bottom page unit of the whole block BLK1 in FIG. 4, using the start page address/index to find the boundary page position can minimize the time period tRead2 of reading and checking required page data. The performance of the storage device 100 can be improved. This is similar for the example in FIG. 5, and for example the start page address/index can be used as the top position of the search range for the example in FIG. 5. The operations are not detailed for brevity.

Figure 16:
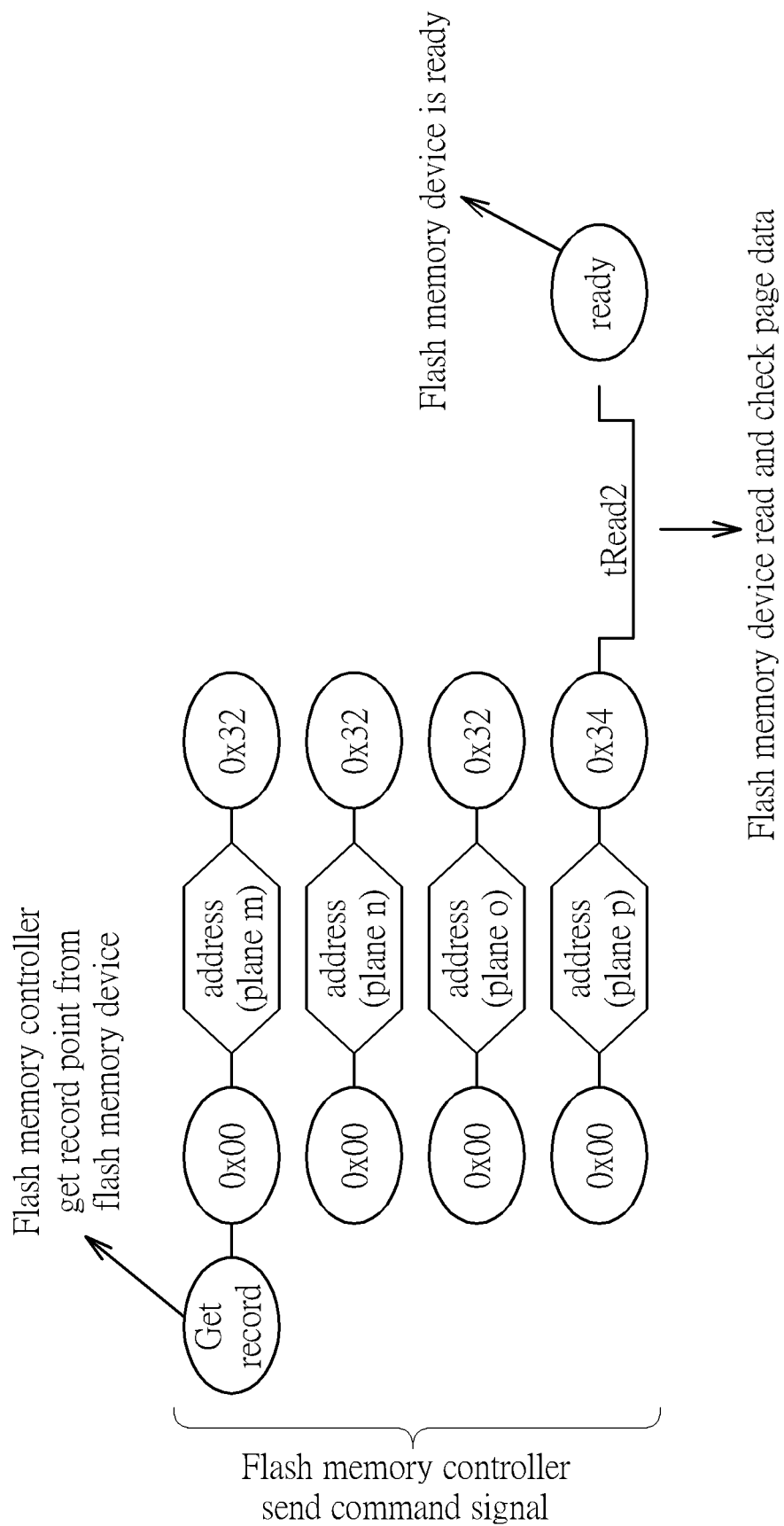
FIG. 16 is a diagram showing an example of the flash memory controller sequentially sending multiple specific boundary check command signals to the flash memory device according to another embodiment of the invention.

FIG. 16 is a diagram showing an example of the flash memory controller 105 (or the processor 1051) sequentially sending multiple specific boundary check command signals to the flash memory device 110 according to another embodiment of the invention. In this embodiment, before sending the specific boundary check command signals, the flash memory controller 105 (or the processor 1051) is arranged to control the flash memory device 110 reading the information of the updated temporary page position(s) from the storage space SS into the I/O control circuit 1101 and transmitting the updated temporary page position(s) (i.e. record point(s)) back to the flash memory controller 105, so that the flash memory controller 105 (or the processor 1051) can use the temporary page position(s) as start page address(es) for the search range(s) of specific block(s). Then, after getting the record point(s), the flash memory controller 105 (or the processor 1051) sends the specific boundary check command signals. In this example, a first boundary check command signal sequentially comprises a boundary check prefix command such as 0x00, a first address information (including a first block address with a first start page address) corresponding to a first plane such as the m-th plane, and an intermediate command such as 0x32 (but not limited). A second boundary check command signal sequentially comprises a boundary check prefix command such as 0x00, a second address information (including a second block address with a second start page address) corresponding to a second plane such as the n-th plane, and an intermediate command such as 0x32. A third boundary check command signal sequentially comprises a boundary check prefix command such as 0x00, a third address information (including a third block address with a third start page address) corresponding to a third plane such as the o-th plane, and an intermediate command such as 0x32. A fourth boundary check command signal sequentially comprises a boundary check prefix command such as 0x00, a fourth address information (including a fourth block address with a fourth start page address) corresponding to a fourth plane such as the p-th plane, and a boundary check confirm command such as 0x34. It should be noted that the above-mentioned block addresses can be identical, partially different, or different, and the above-mentioned start page addresses may be identical, partially different, or different. Also, similarly, after receiving the multiple boundary check command signals, the flash memory device 110 is arranged to read out page data of one or more page units of the four blocks respectively at the four different planes based on the designated block addresses and to check whether the page units are empty pages or not. The check operation is similar and not detailed for brevity. Further, the multiple different blocks may form a super block. This is not meant to be a limitation.

Figure 17:
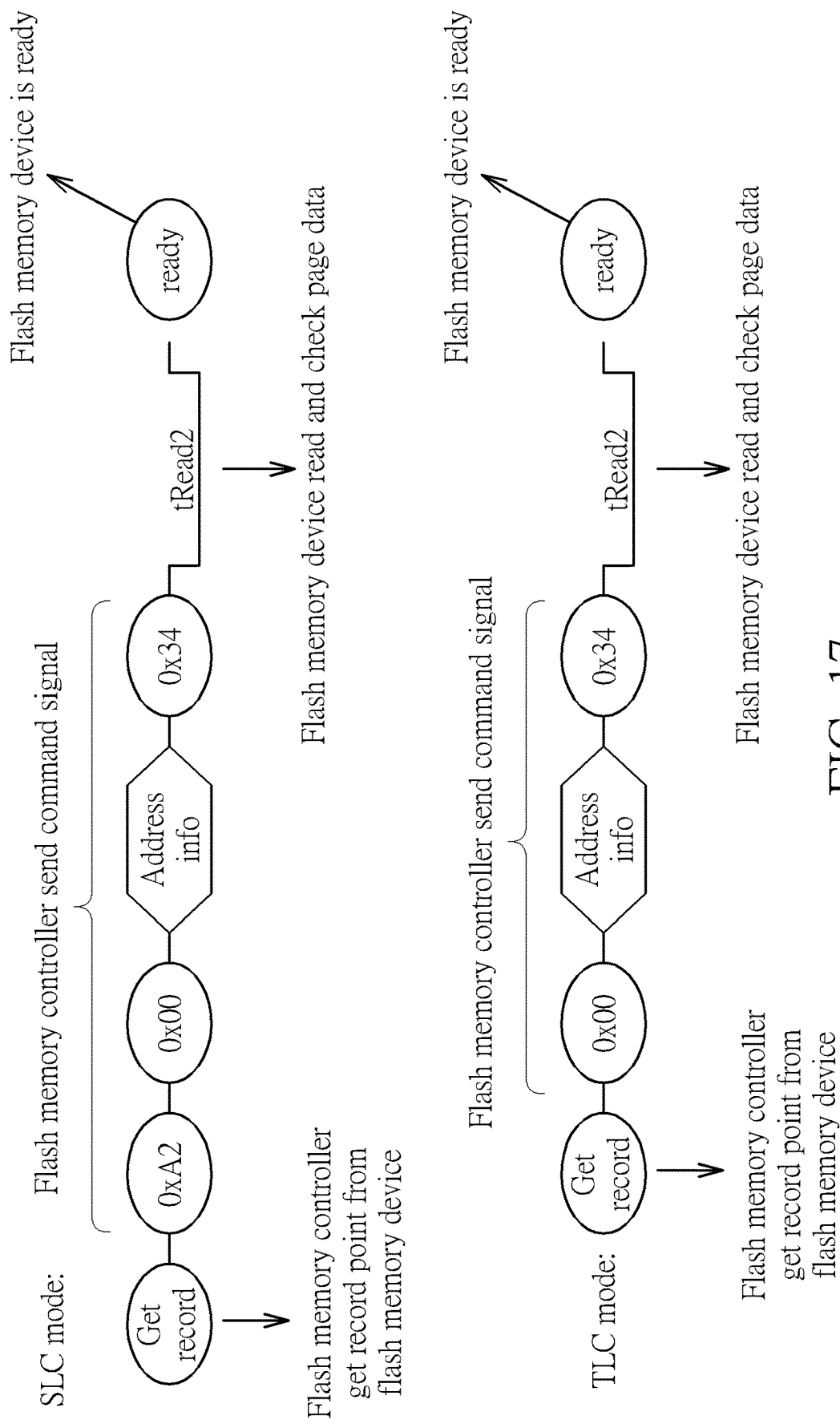
FIG. 17 is a diagram of the examples of the flash memory controller sending different specific boundary check command signals to the flash memory device for the SLC mode and TLC mode respectively according to another embodiment of the invention.

FIG. 17 is a diagram of the examples of the flash memory controller 105 sending different specific boundary check command signals to the flash memory device 110 for the SLC mode and TLC mode respectively according to another embodiment of the invention. In this embodiment, for the SLC mode or TLC mode, before sending a boundary check command signal, the flash memory controller 105 (or the processor 1051) is arranged to control the flash memory device 110 reading the information of the updated temporary page position from the storage space SS into the I/O control circuit 1101 and transmitting the updated temporary page position (i.e. a record point) back to the flash memory controller 105, so that the flash memory controller 105 (or the processor 1051) can use the temporary page position as a start page address for the search range of a specific block. Then, after getting the record point, the flash memory controller 105 (or the processor 1051) sends the boundary check command signal. For the SLC mode, before sending a first specific boundary check command signal, the flash memory controller 105 (or the processor 1051) is arranged to control the flash memory device 110 reading the information of the updated temporary page position from the storage space SS into the I/O control circuit 1101 and transmitting the updated temporary page position (i.e. a record point) back to the flash memory controller 105, so that the flash memory controller 105 (or the processor 1051) can use the temporary page position as a start page address/index for the search range of a specific block. Then, after getting the record point, the flash memory controller 105 (or the processor 1051) sends the first specific boundary check command signal which sequentially comprises an SLC mode indication command such as 0xA2 (but not limited), a boundary check prefix command such as 0x00, specific address information (including an SLC block address with the start page address), and a boundary check confirm command such as 0x34. Similarly, for the TLC mode, before sending a second specific boundary check command signal, the flash memory controller 105 (or the processor 1051) is arranged to control the flash memory device 110 reading the information of the updated temporary page position from the storage space SS into the I/O control circuit 1101 and transmitting the updated temporary page position (i.e. a record point) back to the flash memory controller 105, so that the flash memory controller 105 (or the processor 1051) can use the temporary page position as a start page address/index for the search range of a specific block. Then, after getting the record point, the flash memory controller 105 (or the processor 1051) sends the second specific boundary check command signal which may sequentially comprise a boundary check prefix command such as 0x00, specific address information (including a TLC block address with the start page address), and a boundary check confirm command such as 0x34, without an SLC mode indication command such as 0xA2. The other operations in the embodiments of FIG. 17 are similar to the operations in the embodiments in FIG. 7, and are not detailed for brevity.

Figure 18:
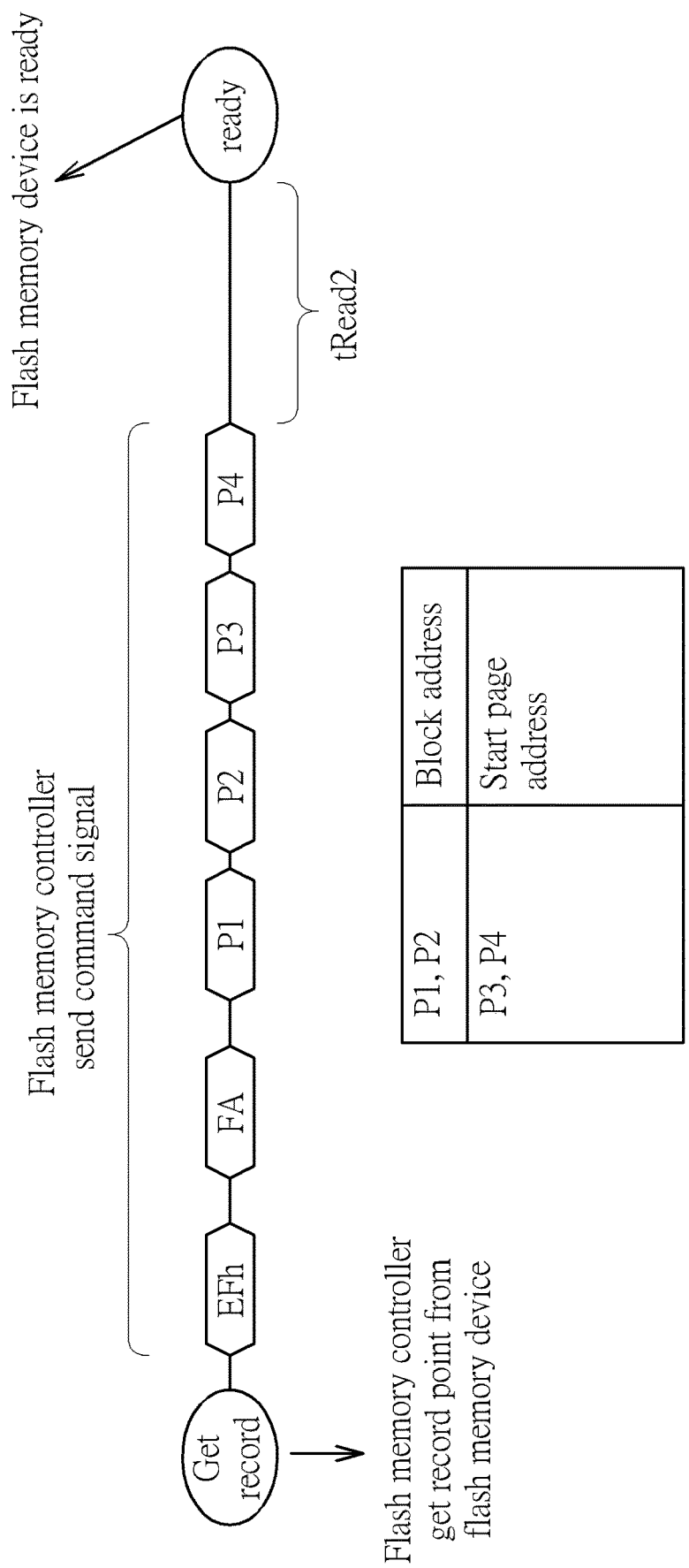
FIG. 18 is a diagram of an example format of a specific boundary check set-feature signal sent from the flash memory controller to the flash memory device via the specific communication interface according to another embodiment of the invention.

FIG. 18 is a diagram of an example format of a specific boundary check set-feature signal sent from the flash memory controller 105 to the flash memory device 110 via the specific communication interface according to another embodiment of the invention. In FIG. 18, before sending a boundary check set-feature signal, the flash memory controller 105 (or the processor 1051) is arranged to control the flash memory device 110 reading the information of the updated temporary page position from the storage space SS into the I/O control circuit 1101 and transmitting the updated temporary page position (i.e. a record point) back to the flash memory controller 105, so that the flash memory controller 105 (or the processor 1051) can use the temporary page position as a start page address/index for the search range of a specific block. Then, after getting the record point, the flash memory controller 105 (or the processor 1051) sends the boundary check set-feature signal which may sequentially comprise a set-feature command such as EFh, a specific feature address FA, and one or more parameter data such as four parameter data P1, P2, P3, and P4. The value of the specific feature address FA can be configured to be associated with and to indicate that this set-feature signal is used to control the flash memory device 110 automatically checking and finding the boundary page position in a specific block, and for example its value can be 24h (but not limited). The four parameter data P1, P2, P3, and P4 for example can be implemented by four bytes. The first and second parameter data P1 and P2 for example can be used to indicate and specify the information of a specific block address and/or the information of a specific LUN (logical unit number) or die address. The third parameter data P3 and fourth parameter data are used to indicate and specify the information of the start page address. By doing so, after receiving the specific boundary check set-feature signal, the flash memory device 110 can use the decreased and smaller page search range to read and check page unit(s) of the specific block based on the information of the specific block address to determine the information of the boundary page position(s). The operations are similar and not detailed for brevity.

Figure 19:
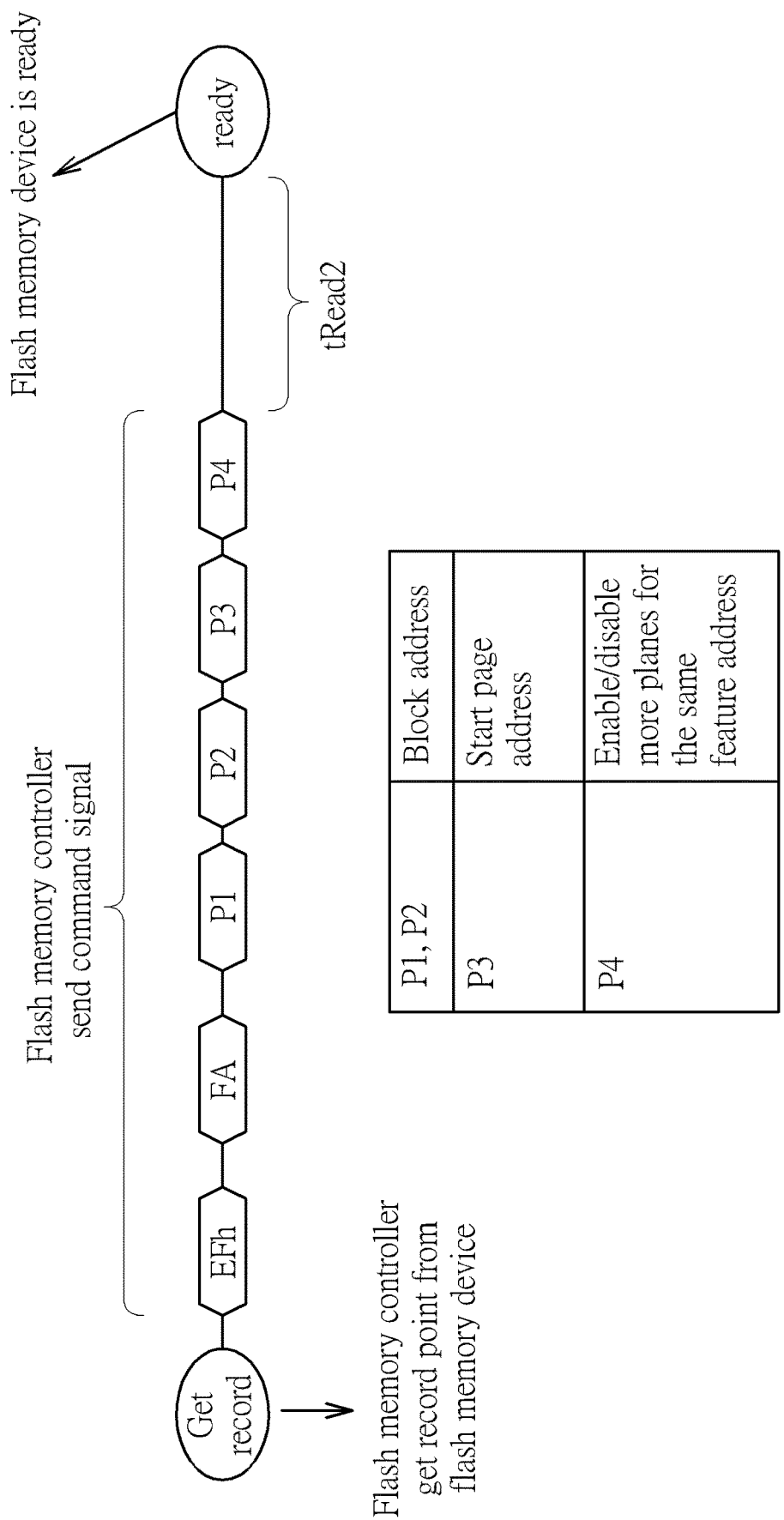
FIG. 19 is a diagram of an example format of a specific boundary check set-feature signal sent from the flash memory controller to the flash memory device via the specific communication interface according to another embodiment of the invention.

FIG. 19 is a diagram of an example format of a specific boundary check set-feature signal sent from the flash memory controller 105 to the flash memory device 110 via the specific communication interface according to another embodiment of the invention. In FIG. 19, the first and second parameter data P1 and P2 for example can be used to indicate and specify the information of a specific block address and/or the information of a specific LUN (logical unit number) or die address. The third parameter data P3 is used to indicate and specify the information of the start page address. The fourth parameter data P4 can be used to indicate whether to enable the more planes for the same feature address. For example (but not limited), the same feature address carried in the boundary check set-feature signal is used for more or all planes if the fourth parameter data P4 indicates a first logic bit '1', and the same feature address carried in the boundary check set-feature signal is used for only one plane if the fourth parameter data P4 indicates a second logic bit '0'.

Additionally, in the embodiments of FIG. 15, FIG. 16, FIG. 17, FIG. 18, and FIG. 19, after the flash memory device 110 becomes ready, the flash memory controller 105 (or the processor 1051) can still be arranged to perform the corresponding operations similar to those mentioned in the embodiments of FIG. 8, FIG. 9, FIG. 10, FIG. 11, or FIG. 12, to control the flash memory device 110 outputting the information of the boundary page position to the flash memory controller 105. The operations are similar and not detailed for brevity.

Further, it should be noted that in other embodiments any one of the above-mentioned command can be implemented by using other different command(s) which can be configured to be different from a standard command (or a vendor specific command) and may be implemented by using reserved command(s) such as 0Bh, 12h, 14h, 18h, 1Bh-1Ch, 62h-64h, AAh, 76h, 82h-83h, 86h, and 8Eh wherein 'h' means hexadecimal. The following table shows the different examples of the reserved commands which can be used to implement the command(s):

| Type | Opcode |
|---|---|
| Standard Command Set | 00h, 05h-06h, 10h-11h, 15h, 30h-32h, 35h, 3Fh, 60h, 70h, 78h, 80h-81h, 85h, 90h, D0h-D1h, D4h-D5h, D9h, E0h-E2h, ECh-EFh, F1h-F2h, F9h, FAh, FCh, FFh |
| Vendor Specific | 01h-04h, 07h-0Ah, 0Ch-0Fh, 13h, 16h-17h, 19h-1Ah, 1Dh-2Fh, 33h-34h, 36h-3Eh, 40h-5Fh, 61h, 65h-6Fh, 71h-75h, 77h, 79h-7Fh, 84h, 87h-8Dh, 8Fh, 91h-CFh, D2h-D3h, D6h-D8h, DAh-DFh, E3h-EBh, F0h, F3h-F8h, FBh, FD-FEh |
| Reserved | 0Bh, 12h, 14h, 18h, 1Bh-1Ch, 62h-64h, 76h, 82h-83h, 86h, 8Eh |

Further, it should be noted that in other embodiments any one of the above-mentioned feature address can be implemented by using the other different values such as a reserved feature address value or a vendor specific feature address value that is not used by a vendor. The examples of its corresponding information and descriptions of the feature information FA can be indicated by the following table:

| Feature Address | Description |
|---|---|
| 00h | Reserved |
| 01h | Timing Mode |
| 02h | NV-DDR2/NV-DDR3/NV-LPDDR4 Configuration |
| 03h-0Fh | Reserved |
| 10h | I/O Drive Strength |
| 11h-1Fh | Reserved |
| 20h | DCC, Read, Write Tx Training |
| 21h | Write Training RX |
| 22h | Channel ODT configuration for NV-LPDDR4 |
| 23h | Internal VrefQ value |
| 24h-2Fh | Reserved |
| 30h | External Vpp Configuration |
| 31h-4Fh | Reserved |
| 50h | Reserved |
| 51h-57h | Reserved |
| 58h | Volume Configuration |
| 59h-5Fh | Reserved |
| 60h | Reserved |
| 61h | Reserved |
| 62h-7Fh | Vendor specific |
| 80h-FFh | Vendor specific |

In one embodiment, the feature information FA for example can be a feature address such as value of 0x24 (i.e. 24h) wherein 'h' means hexadecimal. In other embodiment, the reserved examples, e.g. 00h, 03h-0Fh, 11h-1Fh, 24h-2Fh, or other reserved addresses, can be used to implement the feature information FA. This is not meant to be a limitation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory device to be used in a storage device and coupled to a flash memory controller of the storage device through a specific communication interface, the flash memory device comprising:
    an input/output (I/O) control circuit, coupled to the flash memory controller through the specific communication interface;
    a command register, coupled to the I/O control circuit, for buffering command information sent from the flash memory controller and transmitted through the I/O control circuit;
    an address register, coupled to the I/O control circuit, for buffering address information sent from the flash memory controller and transmitted through the I/O control circuit;
    a memory cell array, at least having a first plane and a second plane which is different from the first plane;
    at least one address decoder, coupled to the memory cell array;
    a status register, coupled to the I/O control circuit; and
    a control circuit, coupled to the logic control circuit, the memory cell array, the address register, the command register, and the status register, for controlling the at least one address decoder to read out more page data of multiple page units from a specific block in the memory cell array to determine whether the multiple page units are empty pages in response to a specific boundary check command signal or a specific boundary check set-feature signal sent from the flash memory controller via the specific communication interface, to determine a boundary page position of the specific block and transmit the boundary page position from the flash memory device into the flash memory controller;
    wherein determining whether the multiple page units are empty pages is performed within the flash memory device and not performed by the flash memory controller; the control circuit is arranged for controlling the at least one address decoder to read out page data of page units from specific blocks at multiple planes in the memory cell array to determine whether the page units are empty pages in response to multiple boundary check command signals sequentially sent from the flash memory controller via the specific communication interface; the multiple boundary check command signals comprises a first boundary check command signal and a second boundary check command signal; the first boundary check command signal carries a first block address of a first plane, and the second boundary check command signal carries a second block address of a second plane; the first block address is identical to or different from the second block address.

2. The flash memory device of claim 1, wherein the control circuit is arranged to determine the boundary page position between data pages and empty pages of the specific block.

3. The flash memory device of claim 1, wherein the specific boundary check command signal sequentially comprises a boundary check prefix command, a specific address information, and a boundary check confirm command, and the specific address information is used to indicate a specific block address of the specific block.

4. The flash memory device of claim 1, wherein the specific boundary check set-feature signal sequentially comprises a set-feature command, a specific feature address, a first parameter data, a second parameter data, a third parameter data, and a fourth parameter data; the specific feature address is associated with controlling the flash memory device to find and determine whether the multiple page units are the empty pages; the first parameter data and the second parameter data are used to indicate a specific block address of the specific block; the third parameter data is used to indicate whether to enable or disable that an identical feature address is used for multiple planes; and, the fourth parameter data is reserved.

5. The flash memory device of claim 1, wherein the flash memory device is arranged to report and transmit the boundary page position between data pages and empty pages of the specific block to the flash memory controller via the specific communication interface in response to a boundary position report command signal or a boundary position get-feature signal.

6. The flash memory device of claim 5, wherein the boundary position report command signal sequentially comprises a boundary report prefix command, a specific address information indicating a specific block address of the specific block, and a boundary report confirm command; data of the boundary page position is transmitted and follows the boundary report confirm command.

7. The flash memory device of claim 6, wherein the boundary position report command signal sequentially comprises a boundary report prefix command, a specific address information indicating a specific block address of the specific block, and a boundary report confirm command; data of the boundary page position is transmitted from the flash memory device to the flash memory controller after the boundary report confirm command is received.

8. The flash memory device of claim 7, wherein complement data of the boundary page position is transmitted from the flash memory device to the flash memory controller after the data of the boundary page position is transmitted.

9. The flash memory device of claim 5, wherein the boundary position get-feature signal sequentially comprises a get-feature command and a boundary report feature address which is used to indicate a specific plane, and the flash memory device is arranged to report and transmit the boundary page position in the specific block at the specific plane into the flash memory controller after the boundary position get-feature signal is received.

10. The flash memory device of claim 5, wherein the boundary position get-feature signal sequentially comprises a get-feature command and a boundary report feature address which is used to indicate multiple planes, and the flash memory device is arranged to report and transmit boundary page positions in specific blocks at the multiple planes into the flash memory controller after the boundary position get-feature signal is received.

11. A method of a flash memory device to be used in a storage device and coupled to a flash memory controller of the storage device through a specific communication interface, and the method comprises:
    providing an input/output (I/O) control circuit, coupled to the flash memory controller through the specific communication interface;

providing a command register, coupled to the I/O control circuit, for buffering command information sent from the flash memory controller and transmitted through the I/O control circuit;

providing an address register, coupled to the I/O control circuit, for buffering address information sent from the flash memory controller and transmitted through the I/O control circuit;

providing a memory cell array, at least having a first plane and a second plane which is different from the first plane;

providing at least one address decoder, coupled to the memory cell array;

providing at least one address decoder;

providing a status register, coupled to the I/O control circuit;

controlling the at least one address decoder to read out more page data of multiple page units from a specific block in the memory cell array to determine whether the multiple page units are empty pages in response to a specific boundary check command signal or a specific boundary check set-feature signal sent from the flash memory controller via the specific communication interface, to determine a boundary page position of the specific block and transmit the boundary page position from the flash memory device into the flash memory controller; and controlling the at least one address decoder to read out page data of page units from specific blocks at multiple planes in the memory cell array to determine whether the page units are empty pages in response to multiple boundary check command signals sequentially sent from the flash memory controller via the specific communication interface;

wherein determining whether the multiple page units are empty pages is performed within the flash memory device and not performed by the flash memory controller; the multiple boundary check command signals comprises a first boundary check command signal and a second boundary check command signal; the first boundary check command signal carries a first block address of a first plane, and the second boundary check command signal carries a second block address of a second plane; the first block address is identical to or different from the second block address.

12. The method of claim 11, further comprising:
determining the boundary page position between data pages and empty pages of the specific block.

13. The method of claim 11, wherein the specific boundary check command signal sequentially comprises a boundary check prefix command, a specific address information, and a boundary check confirm command, and the specific address information is used to indicate a specific block address of the specific block.

14. The method of claim 11, wherein the specific boundary check set-feature signal sequentially comprises a set-feature command, a specific feature address, a first parameter data, a second parameter data, a third parameter data, and a fourth parameter data; the specific feature address is associated with controlling the flash memory device to find and determine whether the multiple page units are the empty pages; the first parameter data and the second parameter data are used to indicate a specific block address of the specific block; the third parameter data is used to indicate whether to enable or disable that an identical feature address is used for multiple planes; and, the fourth parameter data is reserved.

15. The method of claim 11, further comprising:
reporting and transmitting the boundary page position between data pages and empty pages of the specific block to the flash memory controller via the specific communication interface in response to a boundary position report command signal or a boundary position get-feature signal.

16. The method of claim 15, wherein the boundary position report command signal sequentially comprises a boundary report prefix command, a specific address information indicating a specific block address of the specific block, and a boundary report confirm command; data of the boundary page position is transmitted and follows the boundary report confirm command.

17. The method of claim 16, wherein the boundary position report command signal sequentially comprises a boundary report prefix command, a specific address information indicating a specific block address of the specific block, and a boundary report confirm command; data of the boundary page position is transmitted from the flash memory device to the flash memory controller after the boundary report confirm command is received.

18. The method of claim 17, wherein complement data of the boundary page position is transmitted from the flash memory device to the flash memory controller after the data of the boundary page position is transmitted.

19. The method of claim 15, wherein the boundary position get-feature signal sequentially comprises a get-feature command and a boundary report feature address which is used to indicate a specific plane, and the flash memory device is arranged to report and transmit the boundary page position in the specific block at the specific plane into the flash memory controller after the boundary position get-feature signal is received.

20. The method of claim 15, wherein the boundary position get-feature signal sequentially comprises a get-feature command and a boundary report feature address which is used to indicate multiple planes, and the flash memory device is arranged to report and transmit boundary page positions in specific blocks at the multiple planes into the flash memory controller after the boundary position get-feature signal is received.

21. A flash memory controller to be used in a storage device and coupled to a flash memory device of the storage device through a specific communication interface, the flash memory controller comprising:

an input/output (I/O) circuit, coupled to the flash memory device through the specific communication interface, for sending commands and data between the flash memory device and a processor; and the processor, coupled to the I/O circuit, for controlling the I/O circuit sending a specific boundary check command signal or a specific boundary check set-feature signal via the specific communication interface to the flash memory device, to make the flash memory device read out more page data of multiple page units from a specific block in the memory cell array and to make the flash memory device determine whether the multiple page units are empty pages, to make the flash memory device determine a boundary page position of the specific block and transmit the boundary page position from the flash memory device into the flash memory controller;

wherein determining whether the multiple page units are empty pages is performed within the flash memory device and not performed by the flash memory controller; the flash memory controller is arranged to control the flash memory device reading out page data of page units from specific blocks at multiple planes in the memory cell array and determining whether the page units are empty pages in response to multiple boundary check command signals sequentially sent from the flash memory controller via the specific communication interface; the multiple boundary check command signals comprises a first boundary check command signal and a second boundary check command signal; the first boundary check command signal carries a first block address of a first plane, and the second boundary check command signal carries a second block address of a second plane; the first block address is identical to or different from the second block address.

22. The flash memory controller of claim 21, wherein the flash memory controller controls the flash memory device determining the boundary page position between data pages and empty pages of the specific block.

23. The flash memory controller of claim 21, wherein the specific boundary check command signal sequentially comprises a boundary check prefix command, a specific address information, and a boundary check confirm command, and the specific address information is used to indicate a specific block address of the specific block.

24. The flash memory controller of claim 21, wherein the specific boundary check set-feature signal sequentially comprises a set-feature command, a specific feature address, a first parameter data, a second parameter data, a third parameter data, and a fourth parameter data; the specific feature address is associated with controlling the flash memory device to find and determine whether the multiple page units are the empty pages; the first parameter data and the second parameter data are used to indicate a specific block address of the specific block; the third parameter data is used to indicate whether to enable or disable that an identical feature address is used for multiple planes; and, the fourth parameter data is reserved.

25. The flash memory controller of claim 21, wherein the processor controls the I/O circuit sending a boundary position report command signal or a boundary position get-feature signal, to make the flash memory device report and transmit the boundary page position between data pages and empty pages of the specific block to the flash memory controller via the specific communication interface.

26. The flash memory controller of claim 25, wherein the boundary position report command signal sequentially comprises a boundary report prefix command, a specific address information indicating a specific block address of the specific block, and a boundary report confirm command; data of the boundary page position is transmitted and follows the boundary report confirm command.

27. The flash memory controller of claim 26, wherein the boundary position report command signal sequentially comprises a boundary report prefix command, a specific address information indicating a specific block address of the specific block, and a boundary report confirm command; data of the boundary page position is transmitted from the flash memory device to the flash memory controller after the boundary report confirm command is received.

28. The flash memory controller of claim 27, wherein complement data of the boundary page position is transmitted from the flash memory device to the flash memory controller after the data of the boundary page position is transmitted.

29. The flash memory controller of claim 25, wherein the boundary position get-feature signal sequentially comprises a get-feature command and a boundary report feature address which is used to indicate a specific plane, and the flash memory device is arranged to report and transmit the boundary page position in the specific block at the specific plane into the flash memory controller after the boundary position get-feature signal is received.

30. The flash memory controller of claim 25, wherein the boundary position get-feature signal sequentially comprises a get-feature command and a boundary report feature address which is used to indicate multiple planes, and the flash memory device is arranged to report and transmit boundary page positions in specific blocks at the multiple planes into the flash memory controller after the boundary position get-feature signal is received.

* * * * *